United States Patent
Hiraishi et al.

(12)

(10) Patent No.: US 6,232,542 B1
(45) Date of Patent: May 15, 2001

(54) METHOD OF FABRICATING THERMOELECTRIC DEVICE

(75) Inventors: Hisato Hiraishi, Tokyo; Shigeru Watanabe, Tokorozawa, both of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/101,700

(22) PCT Filed: Nov. 12, 1997

(86) PCT No.: PCT/JP97/04115

§ 371 Date: Jul. 15, 1998

§ 102(e) Date: Jul. 15, 1998

(87) PCT Pub. No.: WO98/22984

PCT Pub. Date: May 28, 1998

(30) Foreign Application Priority Data

Nov. 15, 1996 (JP) .................................................... 8-304846

(51) Int. Cl.$^7$ ........................................................ H01L 35/34
(52) U.S. Cl. ............................................................. 136/201
(58) Field of Search ........................................ 136/201, 203, 136/205, 212; 62/3.2, 3.3

(56) References Cited

U.S. PATENT DOCUMENTS

| 4,081,895 | * | 4/1978 | Germano et al. ........................ 29/573 |
| 5,246,504 | * | 9/1993 | Ohta et al. ............................. 136/201 |
| 5,507,879 | * | 4/1996 | Gyoten et al. ......................... 136/224 |

FOREIGN PATENT DOCUMENTS

| 209 545 | 5/1984 | (DE) . |
| 63-20880 | 1/1988 | (JP) . |
| 5-335630 | 12/1993 | (JP) . |
| 8-29558 | 2/1996 | (JP) . |
| 8-43555 | 2/1996 | (JP) . |
| 8-222770 | 8/1996 | (JP) . |
| 11008416 | * 1/1999 | (JP) . |

* cited by examiner

*Primary Examiner*—Kathryn Gorgos
*Assistant Examiner*—Thomas H Parsons
(74) *Attorney, Agent, or Firm*—Armstrong Westerman Hattori McLeland & Naughton, LLP

(57) ABSTRACT

The invention provides a method of fabricating a thermoelectric device, whereby a grooved block (11) composed of n-type thermoelectric semiconductor and a grooved block (21) composed of p-type thermoelectric semiconductor, provided with a plurality of grooves (16, 26) formed therein, respectively, at a same pitch and parallel with each other, are formed such that a depthwise portion of respective grooved blocks is left intact, and then, an integrated block (3) is formed by fitting and adhering together the grooved blocks (11, 21) composed of the n-type and p-type thermoelectric semiconductors, respectively, filling up gaps in fitting parts with adhesive insulation members. After removing portions of the integrated block (3), other than the fitting parts where the n-type and p-type thermoelectric semiconductors are fitted to each other, n-type and p-type thermoelectric semiconductor pieces are exposed, and by forming electrodes for connecting the pieces to each other alternately and in series, the thermoelectric device is completed. Further, it is preferable to apply a process of exposing the thermoelectric semiconductor pieces and a process of forming the electrodes after applying a process of forming grooves to the integrated block (3) such that a plurality of grooves are formed in the direction crossing the direction in which the grooves (16, 26) have been formed, leaving a depthwise portion of the integrated block (3) intact, and insulation members filling up the grooves thus formed are solidified.

26 Claims, 19 Drawing Sheets

METHOD OF FABRICATING THERMOELECTRIC DEVICE

BACKGROUND OF THE INVENTION

1. Field of the Invention

The present invention relates to a method of fabricating a thermoelectric device for use in a thermoelectric power generator taking advantage of the Seebeck effect, or a cooler taking advantage of the Peltier effect, and more particularly, to a method of fabricating a small sized thermoelectric device incorporating a plurality of thermocouples.

2. Description of the Related Art

In each of the thermocouples making up a thermoelectric device, a voltage is developed by providing a difference in temperature between the opposite ends thereof. This is due to the effect of the Seebeck effect, and a device designed to extract the voltage as electric energy is a thermoelectric power generator. The thermoelectric power generator wherein heat energy can be converted directly into electric energy has attracted much attention as effective means of utilizing heat energy, as represented by the case of waste heat utilization.

Meanwhile, the flow of a current caused to occur through a thermocouple results in generation of heat at one end thereof, and absorption of heat at the other end thereof. This is due to the Peltier effect, and a cooler can be manufactured by taking advantage of such phenomenon of heat absorption. This type of cooler which does not comprise mechanical components and can be reduced in size has an application as a portable refrigerator, or a localized cooler for lasers, integrated circuits, and the like.

Thus, the thermoelectric power generator or cooler made up of the thermoelectric device is simple in construction, and is in a more favorable condition for miniaturization as compared with other types of power generators or coolers, offering high usefulness. For example, with the thermoelectric device for use in the thermoelectric power generator, there will not arise a problem of leakage or depletion of electrolyte as with the case of a redox cell, and the thermoelectric device has therefore promising prospects for application to portable electronic devices such as an electronic wrist watch.

The general construction of a conventional thermoelectric device, and a conventional method of fabricating the same, have been disclosed in, for example, Japanese Patent Laid-open Publication No. 63-20880 or Japanese Patent Laid-open Publication No. 8-43555. The descriptions disclosed therein are concerned with a thermoelectric device for use in generation of power. However, the basic construction thereof is the same as that of a thermoelectric device for use in cooling. Hence, the thermoelectric device for use only in generation of power is described hereinafter to avoid complexity in explanation.

In the conventional thermoelectric device disclosed in the publications described above, p-type and n-type thermoelectric semiconductors are alternately and regularly arranged so that a multitude of thermocouples are formed on a horizontal plane, and the thermocouples thus formed are electrically connected to each other in series.

The thermoelectric device is formed in a sheet-like shape by disposing the thermocouples on a plane, and the upper surface and under surface of the thermoelectric device become faces on which hot junctions and cold junctions of the thermocouples are located, respectively. Generation of electric power in the thermoelectric device is caused to occur by a difference in temperature between the upper surface and the under surface of the device having a sheet-like shape.

Meanwhile, an output voltage of a thermocouple using a BiTe-based material, said to have the highest figure of merit of thermoelectric power generation at present, is about 400 $\mu V/°$ C. per couple.

When such thermocouples as described above are employed in a portable electronic device for use at around room temperature, for example, in an electronic watch, a satisfactory difference in temperature can not be expected to be developed inside the device. For example, in the case of a wrist watch, the temperature difference in a wrist watch developed between body temperature and the ambient temperature will be 2° C. at most.

It follows that not less than about 2000 couples of BiTe-based thermocouples are required to obtain a voltage not lower than 1.5V, necessary for driving an electronic watch.

Furthermore, in the case of an electronic wrist watch, wherein mechanical components and electric circuit components need to be encased therein in spite of a small internal volume thereof in the first place, it is required that a thermoelectric device for power generation, very small in size, be used.

The conventional method of fabricating a thermoelectric device small in size and composed of a multitude of thermocouples has been disclosed in Japanese Patent Laid-open Publication No. 63-20880.

In the method disclosed, a multi-layered body is formed by stacking p-type and n-type thermoelectric semiconductors, in a thin sheet-like shape, on top of each other in layers while interposing a heat insulating material between respective layers, and then by bonding them together. Subsequently, grooves are formed at a given spacing in the multi-layered body, whereupon the grooves are filled up with a heat insulating material, and connecting portions of individual thermoelectric semiconductors are removed, thereby forming n-type and p-type thermocouples, surrounded by the heat insulating material and isolated from each other. By electrically connecting the thermocouples with each other in series, a thermoelectric device is completed.

Then, in the method disclosed in Japanese Patent Laid-open Publication No. 8-43555, p-type and n-type thermoelectric semiconductors, each having a plate-like shape, are first bonded to separate substrates, and thereafter, a grooving process of forming a multitude of grooves at very small spacings in the longitudinal and transverse directions is applied to respective thermoelectric semiconductors.

As a result of the grooving process described above, a multitude of thermoelectric semiconductors, each columnar in shape, and upstanding regularly on top of the respective substrates, resembling a kenzan (a needle-point flower holder for flower arrangement), are formed. The kenzan-like bodies composed of the n-type and p-type thermoelectric semiconductors, respectively, are thus prepared, and joined together such that the respective thermoelectric semiconductors, columnar in shape, are mated with each other. Thereafter, an insulating material is filled between the respective thermoelectric semiconductors.

In the final step of processing, the substrates are removed, and a thermoelectric device is completed by electrically connecting thermocouples with each other in series.

However, with the methods of fabricating the thermoelectric device as described in the foregoing, there will arise a problem that the material used for the thermoelectric semiconductors is prone to breakage during the process of forming the thermoelectric semiconductors into a sheet-like shape, during the grooving process of forming the kenzan-like bodies, and the like, because of the fragile nature of the material itself for the thermoelectric semiconductors.

In particular, for forming as many as not less than 2000 couples of thermocouples in an ultra-small sized thermoelectric device which can be encased in a wrist watch, it is required that the thickness of the respective sheet-like thermoelectric semiconductors or the diameter of the respective columnar thermoelectric semiconductors be set to on the order of 100 μm or less, and consequently, the problem of fragility described above will become quite serious.

SUMMARY OF THE INVENTION

The present invention has been developed in order to solve such problems as encountered with the conventional methods of fabricating the thermoelectric device, and an object of the invention is therefore to provide a method of fabricating with ease and efficiently a thermoelectric device small in size, but incorporating a multitude of thermocouples so as to be able to output a high voltage.

To this end, a method of fabricating a thermoelectric device according to the invention comprises:

- a grooved block fabrication process of forming grooved blocks composed of an n-type thermoelectric semiconductor and p-type thermoelectric semiconductor, respectively, each provided with a plurality of grooves formed at a same pitch and parallel with each other, leaving a depthwise portion of respective grooved blocks intact;
- a fitting process of fitting the grooved blocks composed of the n-type thermoelectric semiconductor and p-type thermoelectric semiconductor formed, respectively, by said grooved block fabrication process to each other such that surfaces of the respective grooved blocks, with the grooves formed thereon, face each other;
- an adhesion process of forming an integrated block by adhering the grooved block composed of the n-type thermoelectric semiconductor and the grooved block composed of p-type thermoelectric semiconductor, fitted to each other by said fitting process, to each other after filling up gaps in fitting parts between the respective grooved blocks with an adhesive insulation member; and
- a thermoelectric semiconductor pieces exposure process of exposing n-type and p-type thermoelectric semiconductor pieces by removing all portions of the integrated block formed by said adhesion process, other than the fitting parts where the grooved block composed of the n-type thermoelectric semiconductor and the grooved block composed of p-type thermoelectric semiconductor are fitted to each other.

When fabricating the thermoelectric device by the method comprising the process described above, a thermoelectric semiconductor material having a problem of fragility is always handled in the form of a unit (block). Hence, delicate processing can be applied to the thermoelectric semiconductor material without causing breakage thereof, enabling the thermoelectric device made up of a plurality of thermocouples composed of a plurality of thermoelectric semiconductor pieces very small in size to be efficiently fabricated with ease.

Further, it is preferable that the method according to the invention further comprises a second grooving process of forming a plurality of grooves in the integrated block formed by the adhesion process, in the direction crossing the direction of the grooves formed by said grooved block fabrication process, leaving a depthwise portion of the integrated block intact; a solidification process of filling the grooves formed by the second grooving process with adhesive insulation members and solidifying the same; and, a thermoelectric semiconductor pieces exposure process, to be applied thereafter, of exposing n-type and p-type thermoelectric semiconductor pieces by removing all portions of the integrated block wherein the adhesive insulation members filling up the grooves are solidified in the solidification process, other than the fitting parts where the grooved blocks composed of the n-type thermoelectric semiconductor and p-type thermoelectric semiconductor, respectively, are fitted to each other.

This will result in a considerable increase in the number of thermocouples making up a thermoelectric device of a same size, and the output voltage of the thermoelectric device when used for generation of power can be raised.

It is yet further preferable that the method according to the invention further comprises a grooving process of forming two grooved integrated blocks by forming a plurality of grooves at a same pitch and in the direction crossing the direction of the grooves formed by the grooved block fabrication process, leaving a depthwise portion of respective integrated blocks intact, in each of the two integrated blocks fabricated by means of the grooved block fabrication process, fitting process, and adhesion process described in the foregoing; a second fitting process of fitting the two grooved integrated blocks to each other such that surfaces thereof with the grooves formed thereon face each other; a second adhesion process of forming a second integrated block by filling up gaps in fitting parts between the two grooved integrated blocks fitted to each other by the fitting process with adhesive insulation members, and solidifying the same; and a thermoelectric semiconductor pieces exposure process, to be applied thereafter, of exposing n-type and p-type thermoelectric semiconductor pieces by removing all depthwise portions of the second integrated block, other than the fitting parts.

This will result in a further considerable increase in the number of thermocouples making up a thermoelectric device of a same size, and the output voltage of the thermoelectric device when used for generation of power can be additionally increased.

In the methods of fabricating the thermoelectric device described, the process of forming the grooved block of the n-type thermoelectric semiconductor and grooved block of the p-type thermoelectric semiconductor by applying a grooving process to an n-type thermoelectric semiconductor block and p-type thermoelectric semiconductor block, respectively, such that a plurality of grooves are formed at a same pitch and in parallel with each other, leaving a depthwise portion of the respective blocks intact may be adopted for the grooved block fabrication process described above.

Otherwise, a process of forming the grooved block of the n-type thermoelectric semiconductor and grooved block of the p-type thermoelectric semiconductor by molding n-type thermoelectric semiconductor material and p-type thermoelectric semiconductor material by use of a mold for the grooved block, respectively, and sintering the same, may be adopted for the grooved block fabrication process described above.

In the methods of fabricating the thermoelectric device described, the thermoelectric device can be completed by applying a process of forming electrodes for connecting the exposed n-type and p-type thermoelectric semiconductor pieces to each other alternately and in series after the thermoelectric semiconductor pieces exposure process.

The method of fabricating the thermoelectric device may also comprise a grooving process applied to an n-type thermoelectric semiconductor composite block, prepared by bonding an n-type thermoelectric semiconductor block to a base, and a p-type thermoelectric semiconductor composite block, prepared by bonding a p-type thermoelectric semiconductor block to a base, for forming a plurality of grooves in the n-type thermoelectric semiconductor block and the p-type thermoelectric semiconductor block, respectively, at a same pitch, and to a depth close to the interface between the respective thermoelectric semiconductor blocks and the base thereof; forming an n-type thermoelectric semiconductor composite block and p-type thermoelectric semiconductor composite block, with the grooves formed therein, respectively; and, the fitting process, adhesion process, second grooving process, solidification process, and the like, applied to a pair of thermoelectric semiconductor composite blocks, with the grooves formed therein, forming an integrated block. Or by means of these processes, two integrated blocks may be formed, and fitted to each other after the second grooving process is applied thereto, forming a second integrated block. Thereafter, the thermoelectric semiconductor pieces exposure process of exposing the n-type and p-type thermoelectric semiconductor pieces by removing the respective bases may be applied.

By adopting the processes described above, the thermoelectric semiconductor material can be fully utilized without wastage.

It may be preferable to use bases having a surface area larger than an area of the bonded surface of the respective thermoelectric semiconductor blocks and to interpose spacers between portions of the bases of the n-type thermoelectric semiconductor composite block and the p-type thermoelectric semiconductor composite block, respectively, where the respective thermoelectric semiconductor blocks do not exist, and in the fitting process, controlling a spacing between the bases to be substantially equivalent to the thicknesses of the respective thermoelectric semiconductor blocks.

BEST MODE FOR CARRYING OUT THE INVENTION

Embodiments of the method of fabricating a thermoelectric device in carrying out the invention in the best mode are described hereinafter.

First Embodiment: FIGS. 1 to 9

Firstly, a first embodiment of the method of fabricating a thermoelectric device according to the invention is described with reference to FIGS. 1 to 9.

Figure 1:
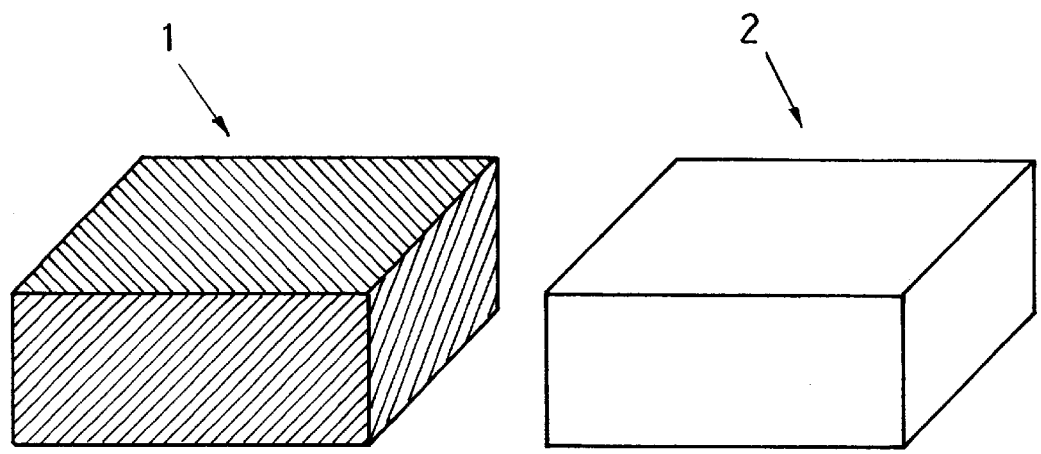
FIGS. 1 to 6 are perspective views of respective processes illustrating a first embodiment of a method of fabricating a thermoelectric device according to the invention.

In the first embodiment of the invention, as shown in FIG. 1, an n-type thermoelectric semiconductor block 1 and a p-type thermoelectric semiconductor block 2 are prepared. It is desirable that the both blocks 1 and 2 be identical in all dimensions including the thickness thereof. For ease in identification of the respective blocks, all the surfaces of the n-type thermoelectric semiconductor block 1 are shown by the diagonally shaded areas. The same applies to all other figures shown hereinafter.

Figure 2:
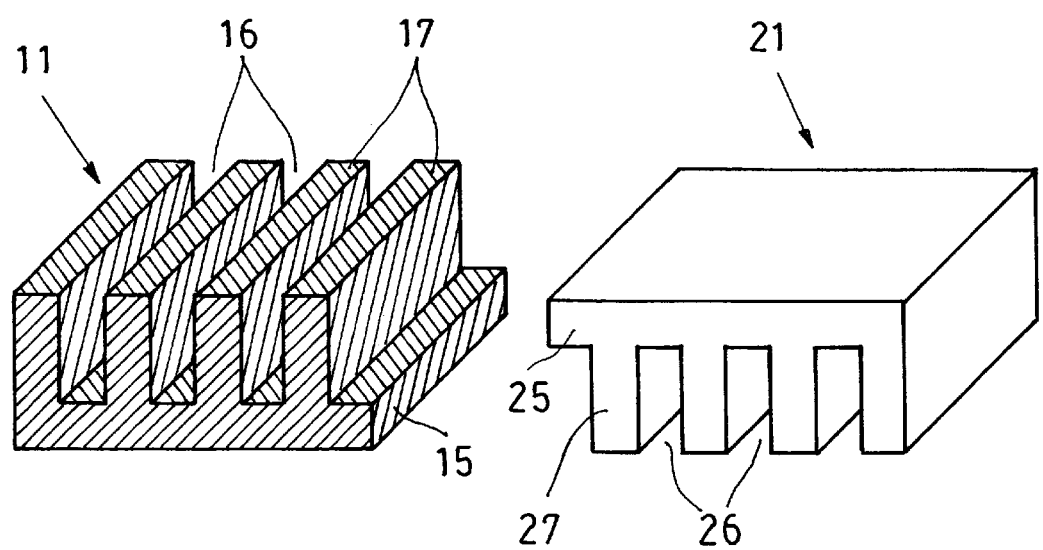

Subsequently, as shown in FIG. 2, a first grooving process of fabricating a grooved block is applied, whereby a plurality of longitudinal grooves 16 at a given pitch are formed parallel with each other in the n-type thermoelectric semiconductor block 1 to a depth such that a thicknesswise portion 15 thereof is left intact, completing an n-type grooved block 11 provided with longitudinal partition walls 17 formed thereon at a predetermined spacing. Similarly, a plurality of longitudinal grooves 26 at a given pitch are formed parallel with each other in the p-type thermoelectric semiconductor block 2 as well to a depth such that a thicknesswise portion 25 thereof is left intact, completing the p-type grooved block 21 provided with longitudinal partition walls 27 formed thereon at a predetermined spacing.

In this instance, the longitudinal partition walls 17 of the n-type grooved block 11 and the longitudinal partition walls 27 of the p-type grooved block 21 are formed in a shape resembling the teeth of a comb, respectively, to enable the grooved blocks 11, 21 to snugly fit to each other, and while the longitudinal grooves 16, 26 are formed at a same pitch, the width of the respective longitudinal grooves 16, 26 is rendered slightly wider than that of the respective longitudinal partition walls 17, 27, to provide room for adhesion.

Further, it is desirable to equalize the depth of the respective longitudinal grooves 16 to that of the respective longitudinal grooves 26.

The first grooving process of forming the longitudinal grooves 16, 26 is applied to the n-type thermoelectric semiconductor block 1 and p-type thermoelectric semiconductor block 2, respectively, by, for example, polishing with the use of a wire saw, or by grinding with the use of a dicing saw.

In the first embodiment of the invention, a BiTeSe sintered body is used as the n-type thermoelectric semiconductor block 1 and a BiTeSb sintered body is used as the p-type thermoelectric semiconductor block 2, the dimensions of the both blocks being set at 12 mm×12 mm×4 mm. The longitudinal grooves 16, 26, each 70 µm wide, are formed at a pitch of 120 µm in the grooved blocks 11 and 21, respectively, to a depth of 3 mm against 4 mm in the thickness of the respective grooved blocks. Accordingly, the width of the respective longitudinal partition walls 17, 27 becomes 50 µm.

The method of fabricating the grooved blocks 11 and 21, composed of thermoelectric semiconductors, is not limited to the method of fine grooving by machining as described above. The same may be fabricated by a molding method such as an injection molding method, or the like, an example of which will be described later.

Figure 3:
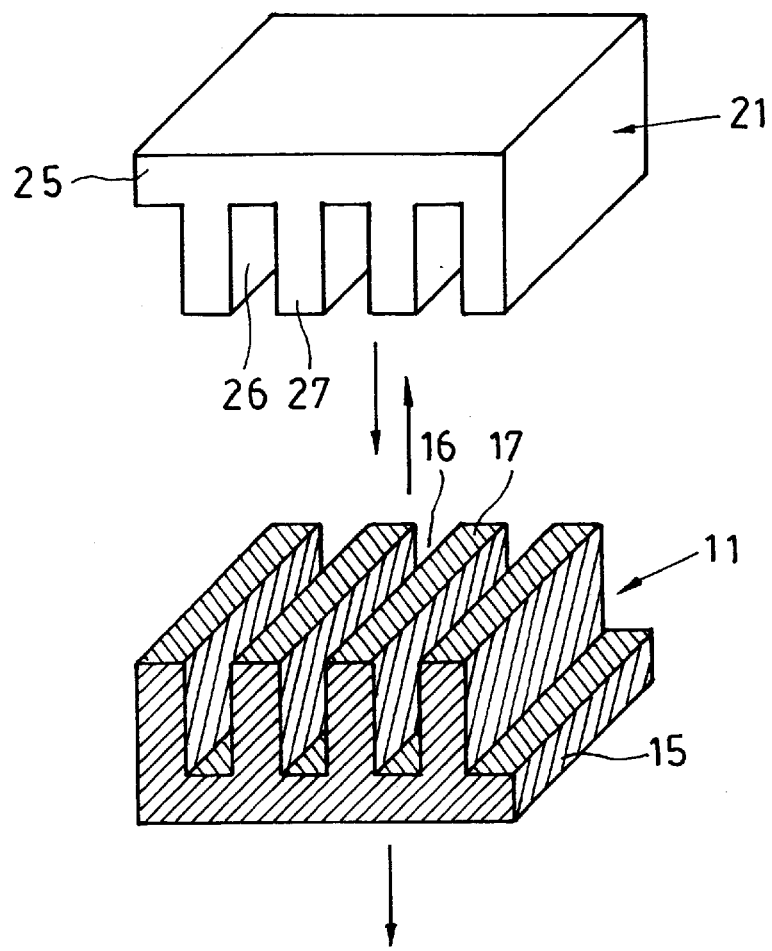
Figure 3:
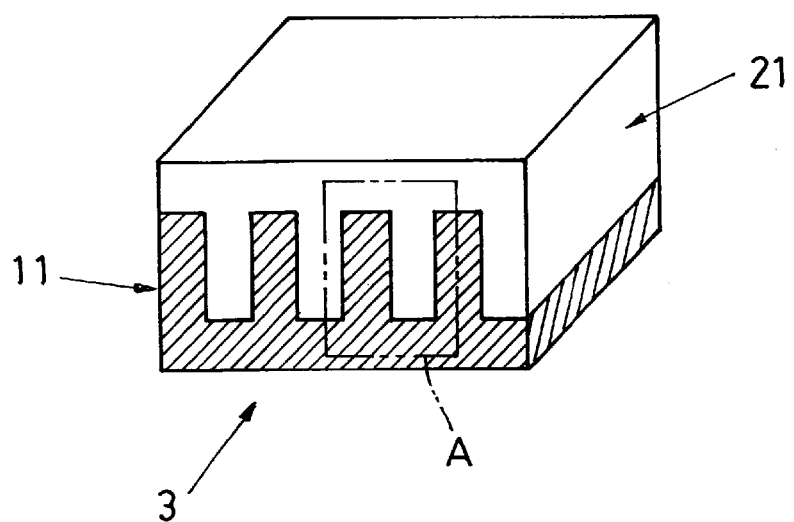

Subsequently, as shown in FIG. 3, a fitting process and adhesion process are applied, whereby the n-type grooved block 11 and p-type grooved block 21 are fitted to each other such that the longitudinal partition walls 27, 17 of the respective blocks are inserted into the longitudinal grooves 16, 26 of the respective opposite blocks, and both blocks are fitted to each other by filling up gaps in fitting parts therebetween with an adhesive insulating material, forming an integrated block 3.

In these processes of forming the integrated block 3, wherein the n-type grooved block 11 and p-type grooved block 21 are fitted to each other, and adhered together with the insulating material, adhesive layers formed thereby need to have the function of ensuring electrical insulation between the n-type grooved block 11 and p-type grooved block 21 besides the function of bonding the two blocks together.

For example, in the case where the inner walls of the longitudinal grooves 16, 26 are finished to have very smooth surfaces by polishing with the use of a wire saw, such electrical insulation can be ensured by simply immersing portions of the integrated block 3 in an adhesive of high fluidity prior to the adhesion process such that gaps between the longitudinal grooves 16, 26 and the longitudinal partition walls 27, 17, respectively, are filled up with the adhesive due to the capillary effect.

Figure 7:
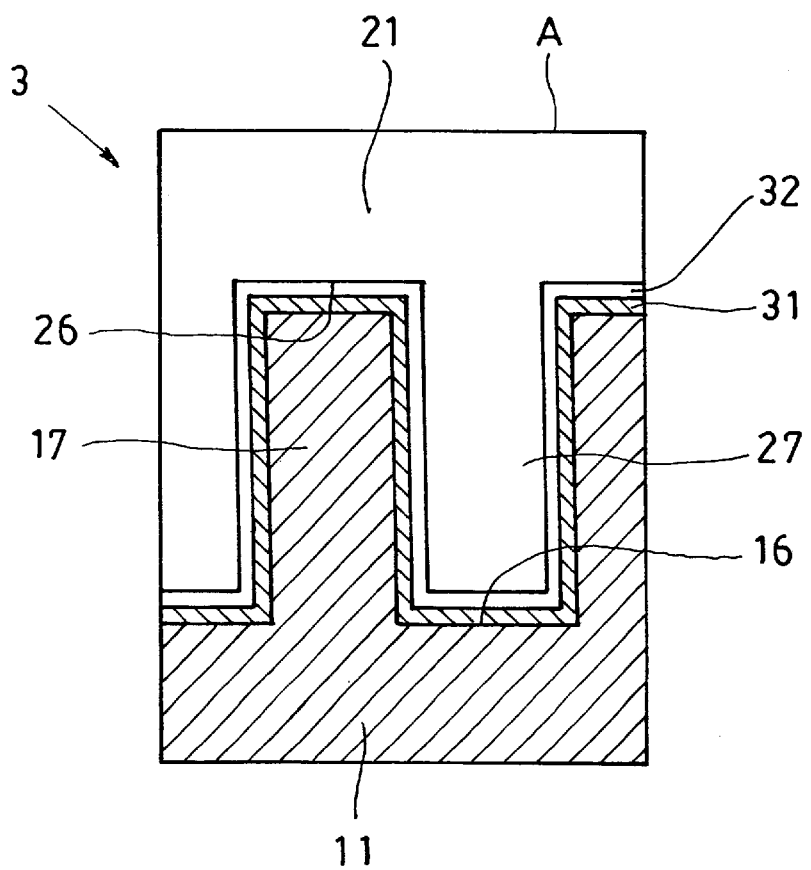
FIGS. 7 and 8 are expanded views of the portion A of an integrated block 3, shown by the imaginary lines in FIG. 3, illustrating variations of the adhesion process.
Figure 8:
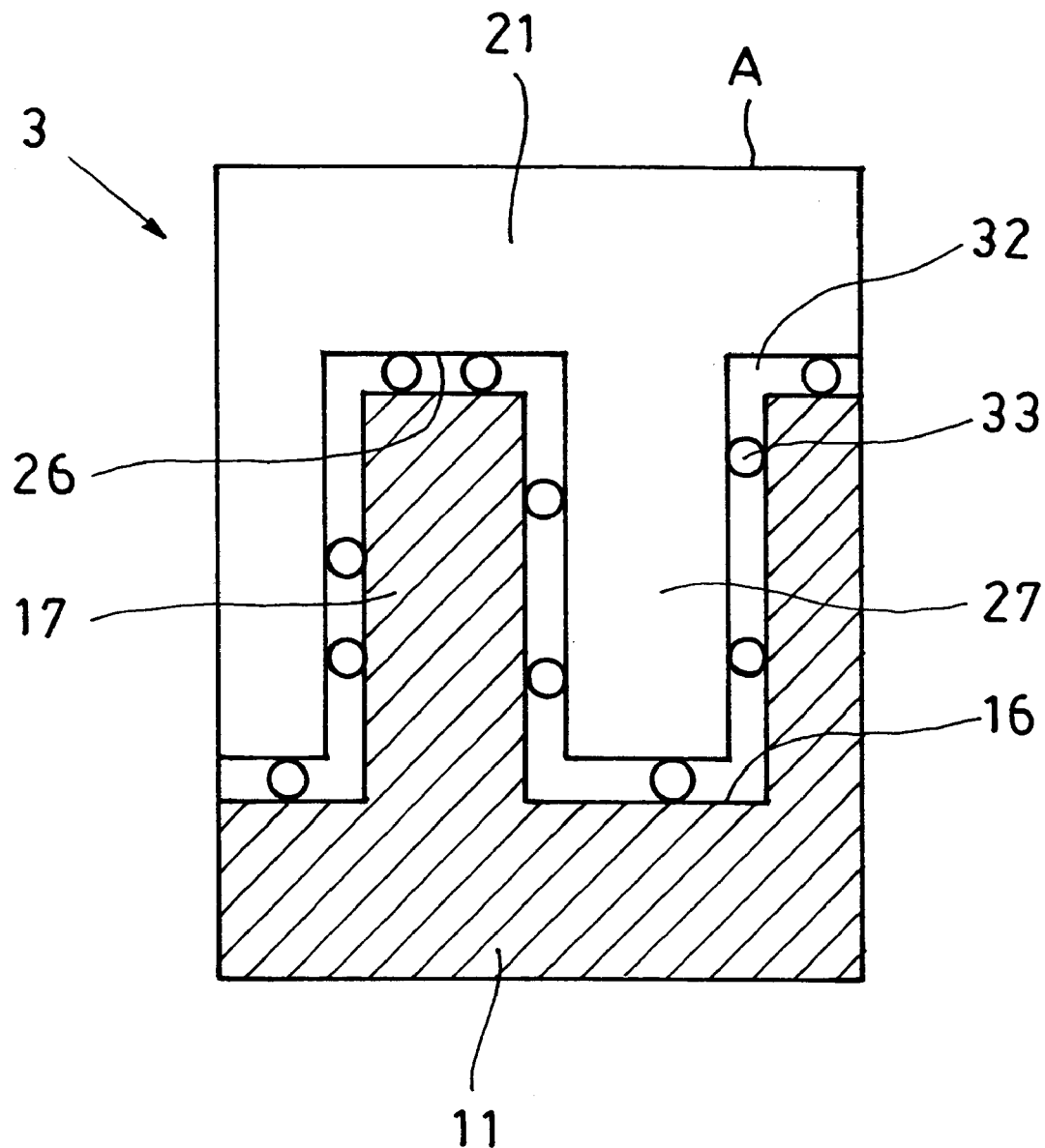

On the other hand, in the case where the inner walls of the longitudinal grooves 16, 26 are finished up into somewhat rough surfaces, maintenance of electrical insulation is ensured by applying a method as illustrated in FIG. 7 or 8 showing an enlarged view of the part A of the integrated block 3, as indicated by the imaginary lines in FIG. 3.

In the method shown in FIG. 7, an insulation film 31 is formed on the surfaces of both the longitudinal partition walls 17 and the longitudinal grooves 16 of the n-type grooved block 11, and the p-type grooved block 21 is fitted onto the insulation film 31 so that gaps between the insulation film 31 and the longitudinal partition walls 27 as well as the longitudinal grooves 26 thereof are filled up with the adhesive taking advantage of the capillary effect as described in the foregoing, forming an adhesive layer 32 after the adhesive is cured. The integrated block 3 is thus completed.

For the insulation film 31, either an inorganic film composed of silicon oxide, aluminum oxide, silicon nitride or the like, or an organic film composed of polyimide or the like may be used.

The insulation film 31 may be alternatively formed on the surfaces of the longitudinal partition walls 27 as well as the longitudinal grooves 26 of the p-type grooved block 21. Further, electrical insulation is additionally ensured by forming the insulation film 31 on the surfaces of both the n-type grooved block 11 and p-type grooved block 21, to be fitted with each other.

In the method shown in FIG. 8, the integrated block 3 is fabricated by use of an adhesive with insulating spacers 33 dispersed therein. For example, 5 wt % of glass beads spherical in shape, 8 µm in average grain size, are added as the insulating spacers 33 to an epoxy adhesive. This will cause the glass beads to be dispersed substantially evenly in the adhesive layer 32 such that the n-type grooved block 11 and p-type grooved block 21 are forced to be isolated spatially from each other by the insulating spacers 33 composed of the glass beads, ensuring electrical insulation therebetween.

Figure 4:
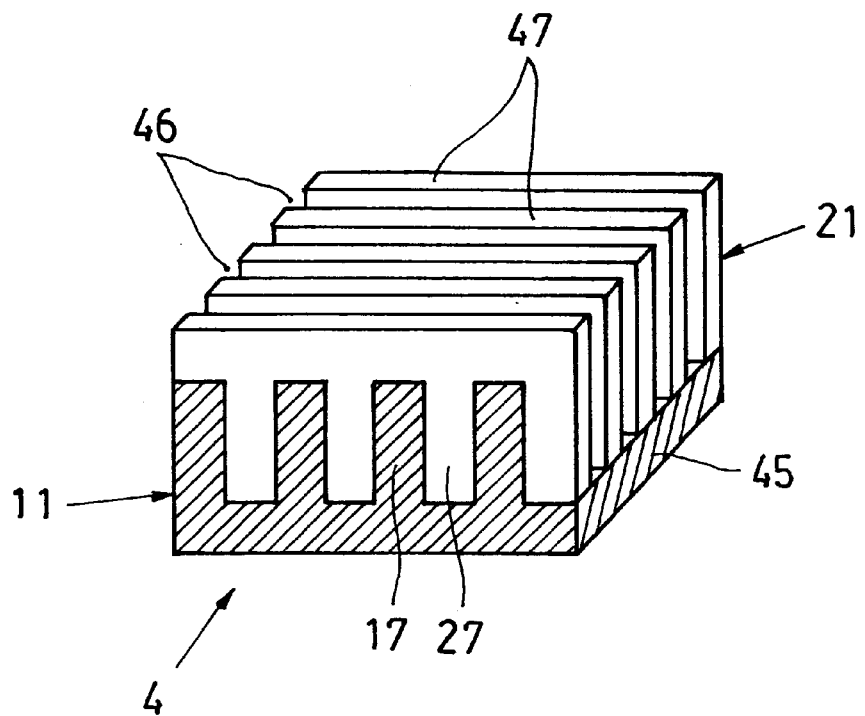

As shown in FIG. 4, a second grooving process is applied to the integrated block 3 shown in FIG. 3, completed by applying the fitting process and adhesion process as described hereinbefore, thereby forming transverse grooves 46. The block shown in FIG. 4, completed by forming the transverse grooves 46 in the integrated block 3, is referred to as a grooved integrated block 4 hereinafter.

In the process of forming the transverse grooves 46, a plurality of the transverse grooves 46 are formed at a given pitch in the direction crossing the direction in which the longitudinal grooves have been formed in the first grooving process as described in FIG. 3, leaving a thicknesswise portion 45 of the grooved integrated block 4 intact so that transverse partition walls 47 are formed at a predetermined spacing. In this process, the transverse grooves 46 may be formed so as to cross the longitudinal grooves 16, 26 formed in the first grooving process at optional angles. However, they most preferably cross at right angles as shown in FIG. 4.

Further, in this embodiment, the transverse grooves 46 are formed in the integrated block 3 from the side of the p-type grooved block 21 as shown in FIG. 4. However, the same may be formed therein conversely from the side of the n-type grooved block 11. Otherwise, the same may be formed in the fitting parts from the front face side or from the rear face side of the integrated block 3 shown in FIG. 3.

The transverse grooves 46 are preferably formed in the integrated block 3 to a depth such that the fitting parts between the n-type grooved block 11 and the p-type grooved block 21 are severed thereby.

As opposed to the case of the longitudinal grooves 16, 26, it is preferable that the width of the respective transverse grooves 46 be rendered as narrow as possible. This is because it is the transverse partition walls 47 that contribute to the capacity of power generation of the thermoelectric device as is shown from subsequent steps of processing, and consequently, from the viewpoint of performance of the thermoelectric device, the regions for the transverse grooves 46 should be reduced in size as much as possible.

Accordingly, in the first embodiment of the invention, the transverse grooves 46, 40 µm in width and 4 mm in depth, are formed at a pitch of 120 µm. Incidentally, the width 40 µm of the respective transverse grooves 46 represents a substantial limit size for the width of a groove formed by processing with the use of a wire saw.

Figure 5:
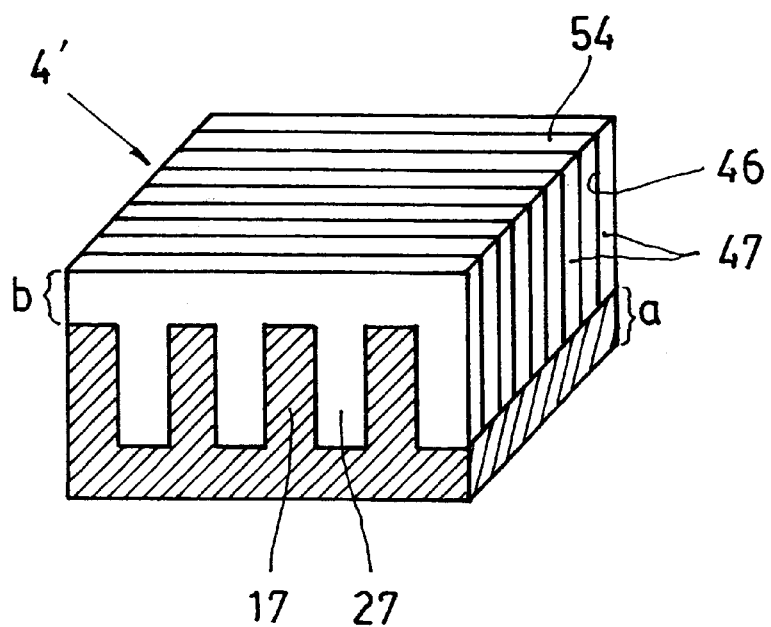

Subsequently to the foregoing step of processing, a solidification process as shown in FIG. 5 is applied. That is, the respective transverse grooves 46 of the grooved integrated block 4 shown in FIG. 4 are filled up with insulating resin (insulation member), forming insulating resin layers 54 after the insulation member is cured. A block solidified with the insulating resin layers 54 is referred to as a grooved integrated block 4' hereinafter.

Thereafter, a process of exposing thermoelectric semiconductor pieces is applied to the grooved integrated block 4' solidified with the insulating resin layers 54, whereby portions (portions having thickness denoted by a, b, respectively, in FIG. 5) of the grooved integrated block 4' which have been left intact without the grooving process applied thereto during the first and second grooving processes described in the foregoing are removed by polishing, or grinding the upper and under surfaces of the grooved integrated block 4', and the remainder is finished up such that only the fitting parts shown in FIG. 3, wherein the longitudinal grooves 16, 26, composed of the n-type thermoelectric semiconductor, and p-type thermoelectric semiconductor, respectively, are fitted to the longitudinal partition walls 27, 17, composed of the p-type thermoelectric semiconductor, and n-type thermoelectric semiconductor, respectively, and a portion wherein the transverse grooves 46 are formed, is left intact. A thermoelectric device block 5 shown in FIG. 6 is thus obtained.

In the thermoelectric device block 5, a multitude of n-type thermoelectric semiconductor pieces 51, and p-type thermoelectric semiconductor pieces 52 are insulated from each other via the insulating resin layers 54, and integrally adhered to each other while the upper as well as under surfaces thereof are exposed.

Figure 6:
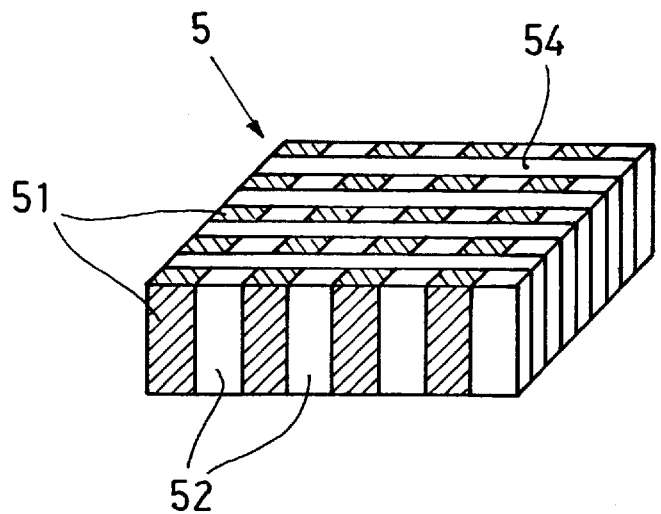
Figure 9:
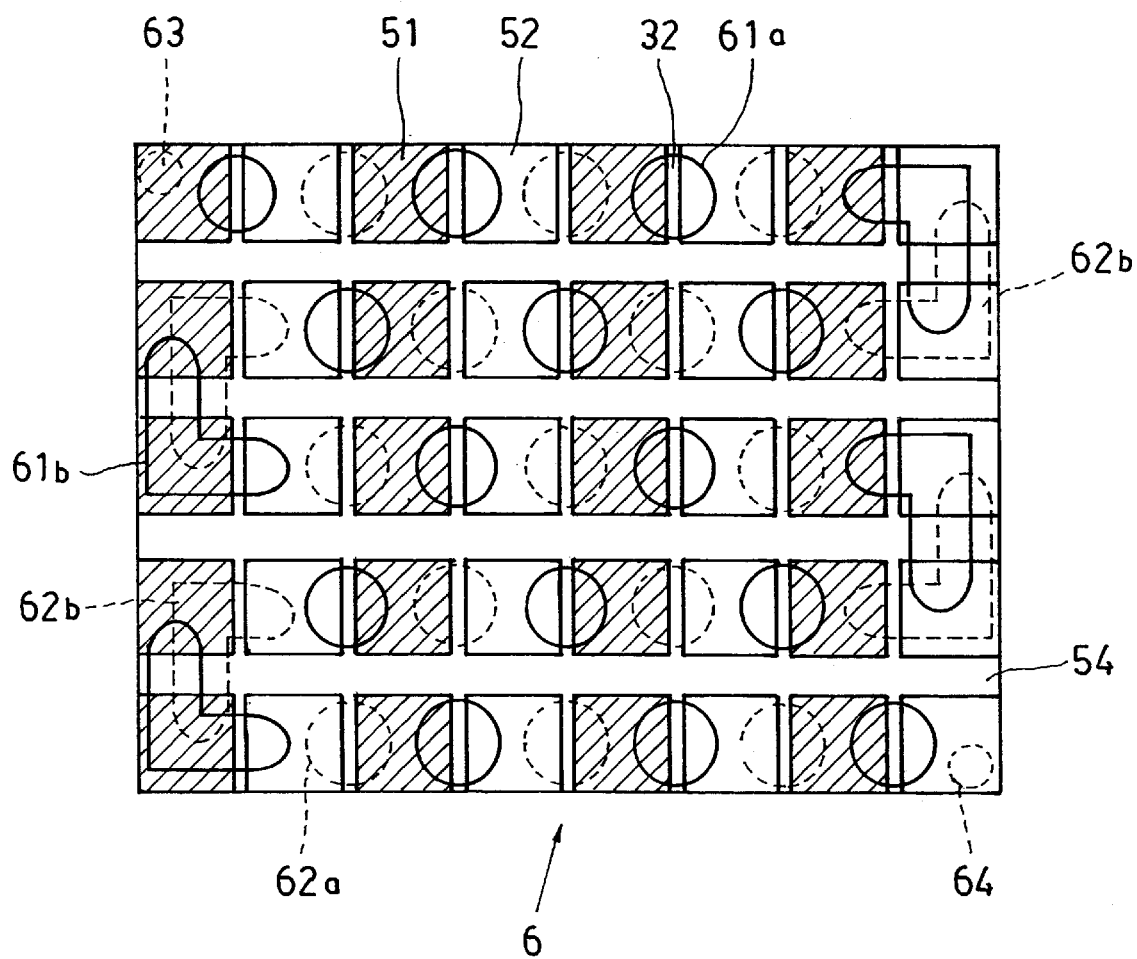
FIG. 9 is a plan view of a completed thermoelectric device according to the first embodiment for explaining the construction of electrodes.

In the final step of processing, a process of forming electrodes is applied to both the upper and under surfaces of the thermoelectric device block 5 shown in FIG. 6 such that the n-type thermoelectric semiconductor pieces 51 and p-type thermoelectric semiconductor pieces 52 are connected with each other, alternately and electrically in series, thereby obtaining a thermoelectric device 6 shown in FIG. 9.

FIG. 9 is a plan view of the thermoelectric device 6, as seen from directly above, illustrating various electrodes formed on the upper as well as under surfaces thereof.

In the figure, upper surface electrodes 61a circular in shape as indicated by the solid lines and under surface electrodes 62a circular in shape as indicated by the broken lines are electrodes for connecting together the n-type thermoelectric semiconductor pieces 51 and p-type thermoelectric semiconductor pieces 52 adjacent to each other, electrically in series, forming a multitude of thermocouples. Upper surface electrodes 61b and under surface electrodes 62b, resembling the letter L in shape, are electrodes required in the periphery region of the thermoelectric device 6 for connecting the n-type or p-type thermoelectric semiconductor pieces in parallel although it is deemed unusable. The respective thermoelectric semiconductor pieces 51, 52 are insulated from each other by means of the adhesive layers 32 and the insulating resin layers 54. Further, under surface electrodes 63, 64, in the shape of a small circle indicated by the broken lines are electrodes for outputting voltage externally.

Each of the electrodes described above is formed by depositing a gold (Au) film on both the upper and under surfaces of the thermoelectric device block 5 shown in FIG. 6 by means of the vacuum coating method, sputtering method, electroless plating method, or the like, and then, by patterning on the gold film by the photolithographic technique and etching technique.

In the case where the upper and under surfaces of the thermoelectric device block 5, on which the electrodes are to be formed, are likely to cause a problem of surface roughness when finished by only grinding as described hereinbefore, it is desirable to render the surfaces smoother by lapping, or the like as this will prevent occurrence of faults with the electrodes (such as breakage) thereof.

For the electrodes, use can be made of not only the gold film but also other metal film, for example, a Cu film, Al film, Ni film, Fe film, or a multi-layer film (for example, Al/Ni film) composed of the aforesaid films combined together. Further, in forming the electrodes, use may be made of the printing method, masked vapor deposition method, or a method whereby the electrodes are patterned beforehand on an insulating sheet-like material made of glass or ceramic, and the sheet-like material as a whole is pasted on the surfaces.

In the method according to the first embodiment of the invention, the longitudinal partition walls 17, 27 and the transverse partition walls 47, composed of the thermoelectric semiconductor materials, and very thin, are formed in the first and second grooving processes as shown in FIGS. 2 and 4. Although these partition walls, individually, are very thin and fragile, the same together constitute an integrated block, and processing operations can be performed on respective blocks as a whole without need of performing delicate operations such as holding individual partition walls for transfer and stacking the same, and the like. Hence, in comparison with the conventional method disclosed in Japanese Patent Laid-open Publication No. 63-20880, it is possible to fabricate a thermoelectric device incorporating a multitude of small sized thermocouples efficiently with ease, overcoming the problem of fragility.

In the case of another conventional method disclosed in Japanese Patent Laid-open Publication No. 8-43555, integrated blocks are used. However, thermoelectric semiconductors are bonded to separate base members, and processed so as to form a multitude of columnar shapes. As a result, extreme difficulties are still encountered in fabrication of a product due to the serious problem of fragility. As opposed to such a method, the method according to the first embodiment of the invention is a method of fabrication whereby thermoelectric semiconductors are always processed when the same are in the form of an integrated block, thus enabling fine structural processing and assembling of thermoelectric semiconductor material, which is a very fragile material, to be carried out with ease. Consequently, it is possible to efficiently fabricate with ease a thermoelectric device provided with a multitude of thermocouples in order to enhance the output voltage.

However, the process of exposing thermoelectric semiconductor pieces may be applied straight to the integrated block 3 shown in FIG. 3 by omitting the second grooving process, and the solidification process whereby grooved parts (the transverse grooves 47 in FIG. 4) are filled up with the insulation member, which is then solidified, forming the insulating resin layers 54 shown in FIG. 5, as applied in carrying out the first embodiment. Such omission, however, will result in a decrease in the number of thermocouples making up the thermoelectric device.

In this case, the grinding process, and the like are applied to the upper as well as under surfaces of the integrated block 3 fabricated by means of the fitting process and adhesion process as shown in FIG. 3, and by removing portions of the integrated block 3, other than parts where the longitudinal partition walls 17, 27 of the n-type grooved block 11 and p-type grooved block 21, respectively, are fitted to the longitudinal grooves 16, 26, the thermoelectric device block with the n-type and p-type thermoelectric semiconductor pieces exposed can be fabricated.

Thereafter, the process of forming the electrodes is applied thereto, whereby electrodes for connecting the exposed n-type and p-type thermoelectric semiconductor pieces (that is, the longitudinal partition walls 17 of the n-type groove block 11 and the longitudinal partition walls 27 of the p-type groove block 21) alternately to each other and in series are formed on the upper as well as under surfaces of the thermoelectric device block, thus fabricating the thermoelectric device.

Second Embodiment: FIGS. 10 to 14

Next, a second embodiment of the method of fabricating a thermoelectric device according to the invention is described hereinafter with reference to FIGS. 10 to 14. In these figures, parts corresponding to those previously described with reference to the first embodiment shown in FIGS. 1 to 5 are denoted by the same reference numerals.

Figure 10:
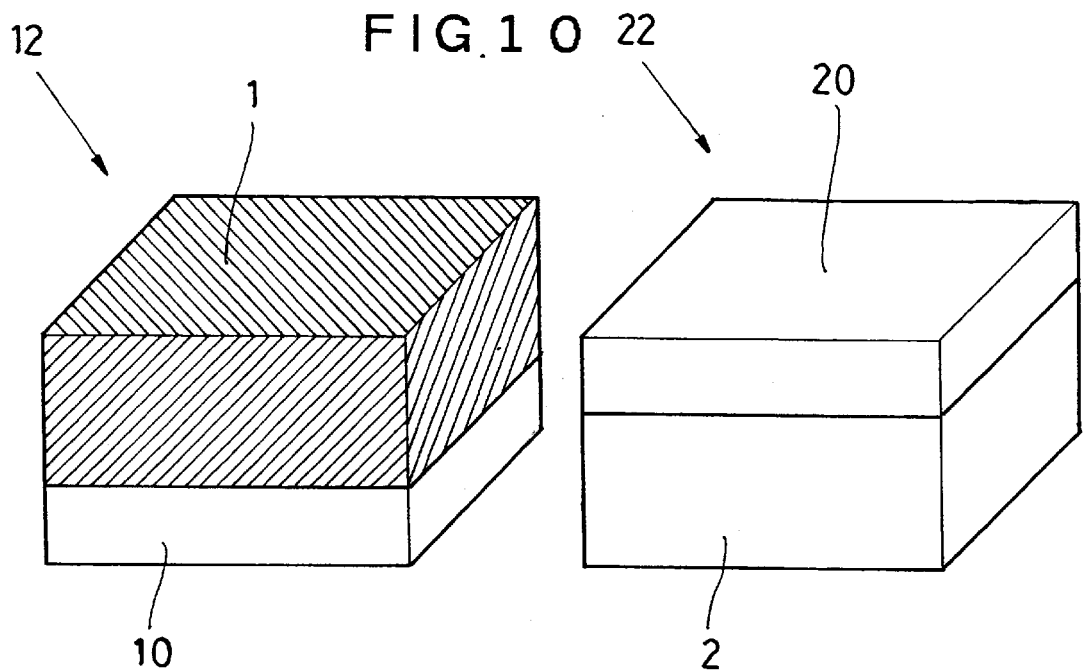
FIGS. 10 to 14 are perspective views of respective processes illustrating a second embodiment of a method of fabricating a thermoelectric device according to the invention.

In the second embodiment, as shown in FIG. 10, an n-type thermoelectric semiconductor composite block 12 formed by bonding an n-type thermoelectric semiconductor block 1 to a base 10, and a p-type thermoelectric semiconductor composite block 22 formed by bonding a p-type thermoelectric semiconductor block 2 to a base 20 are first prepared. It is desirable that the n-type thermoelectric semiconductor block 1 and the p-type thermoelectric semiconductor block 2 be identical in all dimensions including the thickness thereof.

The thermoelectric semiconductor blocks 1, 2 are bonded to the bases 10, 20, respectively, with an adhesive or wax. Further, for the bases 10, 20, use can be made of various materials having a given hardness such as glass, ceramic, plastic, metal, and the like.

Figure 11:
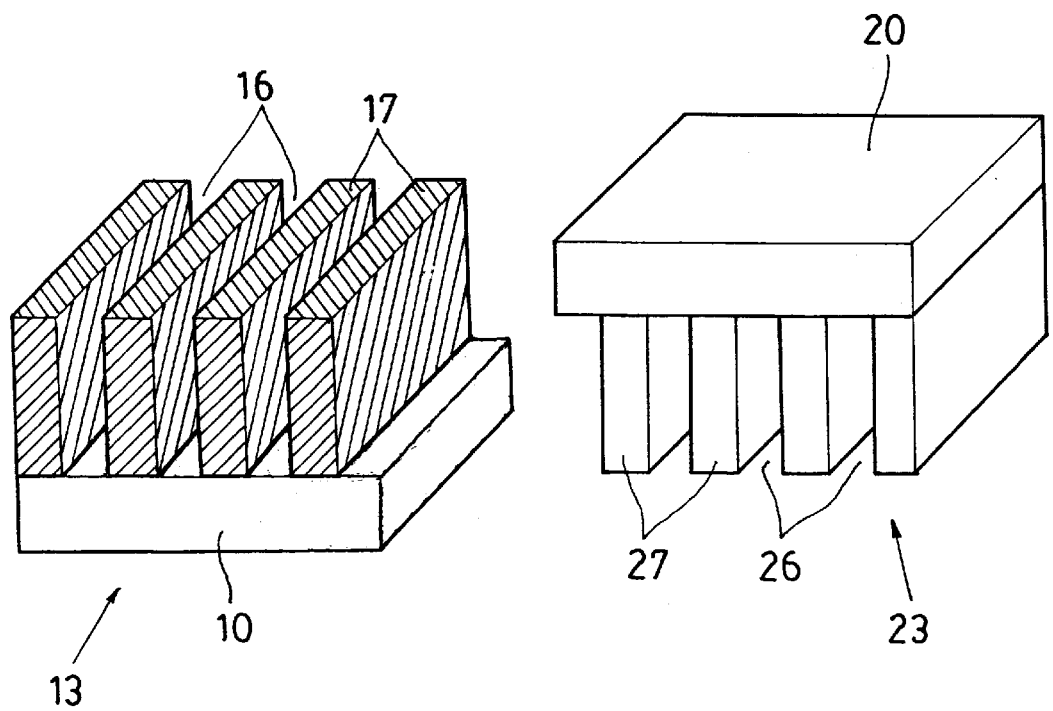

Subsequently, a grooving process, the same as applied in the first grooving process in the first embodiment is applied to the respective thermoelectric semiconductor blocks 1, 2 of the thermoelectric semiconductor composite blocks 12, 22, respectively, and as shown in FIG. 11, longitudinal grooves 16, 26 as well as longitudinal partition walls 17, 27, resembling the teeth of a comb in shape, are formed, fabricating an n-type grooved composite block 13 and a p-type grooved composite block 23. The pitch and width of the longitudinal grooves 16, 26 are the same as in the case of the first embodiment, however, the depth thereof is set to be substantially close to the interface between the thermoelectric semiconductor block 1, or 2 and the base 10 or 20, respectively. More specifically, the depth is selected from among slightly short of the interface, down to just the interface, or below the interface, cutting slightly into the base 10 or 20, depending on the circumstance.

Figure 12:
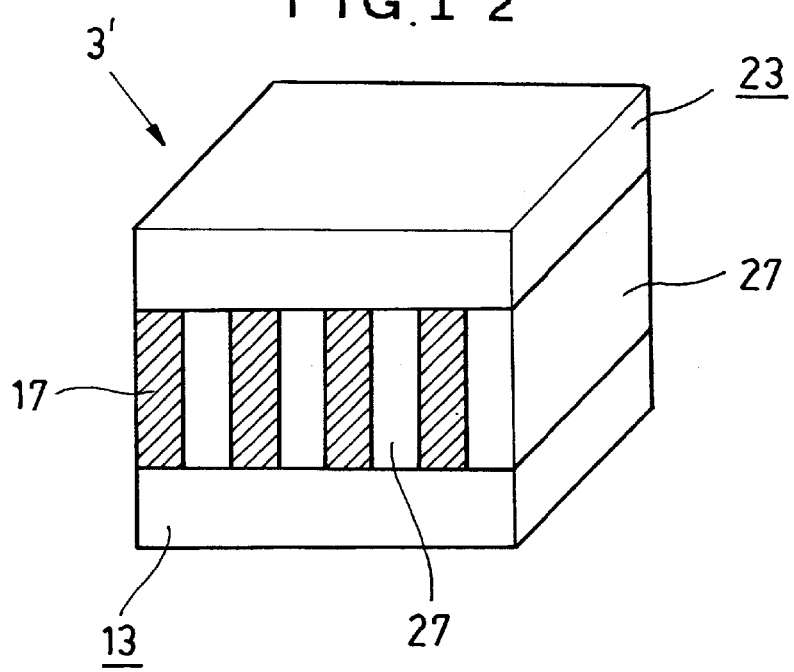

Thereafter, a fitting process whereby the n-type grooved composite block 13 and p-type grooved composite block 23 are fitted to each other such that respective grooved surfaces face each other is applied, and then, an adhesion process whereby gaps in fitting parts between the n-type grooved composite block 13 and p-type grooved composite block 23 which are fitted to each other are filled up with an adhesive insulation member so that the n-type grooved composite block 13 and p-type grooved composite block 23 are adhered to each other is applied, thereby fabricating an integrated block 3' shown in FIG. 12.

Figure 13:
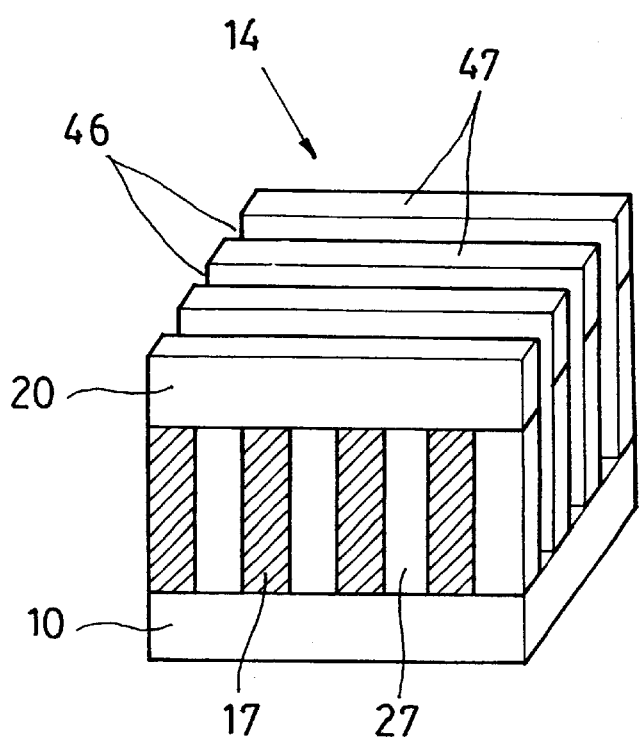

Subsequently, a grooving process, the same as applied in the second grooving process in the first embodiment, as shown in FIG. 4, is applied to the integrated block 3' as shown in FIG. 13, whereby transverse grooves 46 and transverse partition walls 47 are formed, fabricating a grooved integrated block 14. In this instance, the transverse grooves 46 are cut into one of the grooved composite blocks to a depth close to the interface thereof with the base 10 or 20 of the other grooved composite block and in such a direction as to cross (at right angles, in this embodiment) the longitudinal grooves 16, 26, and the longitudinal partition walls 17, 27, formed in the first grooving process.

Figure 14:
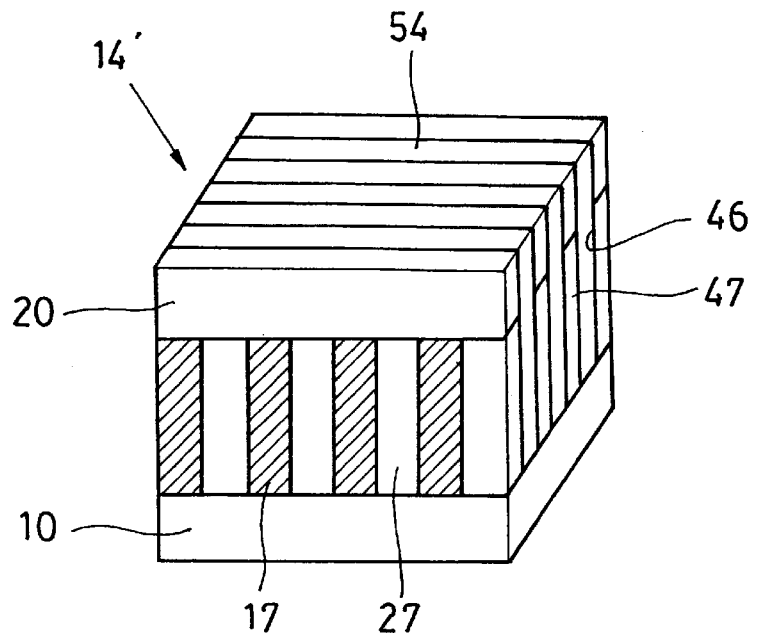

Then, as shown in FIG. 14, a solidification process is applied whereby grooved parts, that is, the transverse grooves 46, are filled up with insulating resin (insulation member), and the insulating resin is then solidified, forming insulating resin layers 54. A block solidified with the insulating resin layers 54 is referred to hereafter as a grooved integrated block 14'.

Thereafter, a process of exposing thermoelectric semiconductor pieces is applied to the grooved integrated block 14' shown in FIG. 14, whereby the bases 10 and 20, that is, bottom and top portions of the grooved integrated block 14', are removed, obtaining a thermoelectric device block 5, the same as shown in FIG. 6 in the case of the first embodiment. The base on the side where the grooving process is applied (the base 20 in the example shown in FIG. 13) may be removed prior to forming the transverse grooves 46.

Further, by applying a process of forming electrodes for forming the electrodes on the upper and under surfaces of the thermoelectric device block 5 such that n-type thermoelectric semiconductor pieces 51 and p-type thermoelectric semiconductor pieces 52 are connected to each other alternately and electrically in series, a thermoelectric device 6, the same as shown in FIG. 9, can be fabricated.

In the method according to the second embodiment, the bases 10, 20 are employed to integrally support the longitudinal partition walls 17, 27, and the transverse partition walls 47 in place of portions left intact without the grooving process applied thereto (the portions 15, 25 shown in FIG. 2) of the thermoelectric semiconductor blocks 1 and 2, respectively, which will be eventually removed by grinding as in the aforesaid first embodiment. Consequently, effective use can be made of portions of the thermoelectric semiconductor material, in regions close to the upper and under surfaces thereof, reducing unusable portions thereof. Therefore, the method has an advantage of remarkably improving the utilization efficiency of the material.

Other merits of operation according to this embodiment are the same as for the first embodiment.

Third Embodiment: FIGS. 15 to 18

Now, a third embodiment of the method of fabricating a thermoelectric device according to the invention is described hereinafter with reference to FIGS. 15 to 18. The first half of a process applied in carrying out the third embodiment is the same as for the first embodiment described with reference to FIGS. 1 to 3, and accordingly, will only be briefly described referring to these figures.

In the third embodiment, two each of the n-type thermoelectric semiconductor blocks 1 and p-type thermoelectric semiconductor blocks 2 as shown in FIG. 1 are prepared. Subsequently, a first grooving process as shown in FIG. 2 is applied to the respective thermoelectric semiconductor blocks, whereby a plurality of longitudinal grooves 16, 26, and longitudinal partition walls 17, 27 are formed at a same pitch, and parallel with each other such that the depth of the former is equal to the height of the latter, fabricating two pairs of n-type grooved blocks 11, and p-type grooved blocks 21.

In this case as well, the two pairs of the n-type grooved blocks 11, and p-type grooved blocks 21 may be fabricated by a process of fabricating grooved blocks using a molding method, which will be described later.

Subsequently, by applying a fitting process as shown in FIG. 3, whereby the respective n-type grooved blocks 11 and p-type grooved blocks 21 are fitted to each other, and a first adhesion process of forming integrated blocks, whereby the grooved blocks fitted are adhered to each other by filling up gaps in fitting parts thereof with an adhesive insulating material, two integrated blocks 3 are fabricated.

Figure 15:
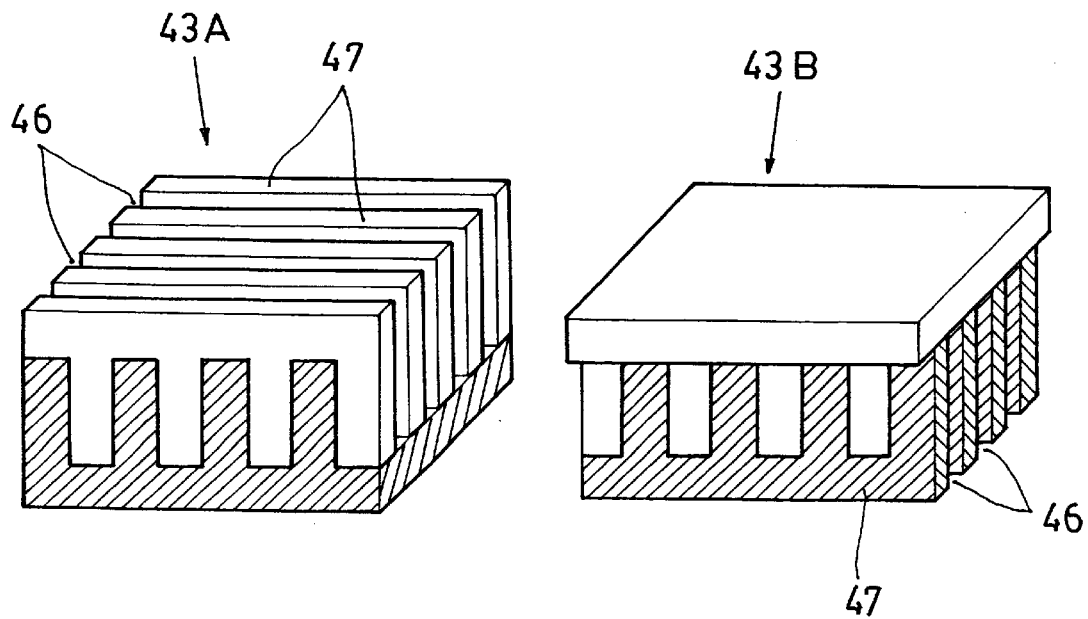
FIGS. 15 to 17 are perspective views showing the latter parts of fabrication processes illustrating a third embodiment of a method of fabricating a thermoelectric device according to the invention.

Thereafter, a second grooving process is applied to one of the two integrated blocks 3 from the side of the p-type grooved block 21 shown in FIG. 3, and to the other from the side of the n-type grooved block 11, whereby a plurality of grooves parallel with each other are formed at a same pitch in the direction crossing the direction in which the first grooving process has been applied, (at right angles, in this embodiment), fabricating a pair of grooved integrated blocks 43A, 43B, wherein a plurality of transverse grooves 46 and transverse partition walls 47 are formed as shown in FIG. 15, the depth of the former being equal to the height of the latter.

In this case, the dimensions of the transverse grooves 46 and transverse partition walls 47 are rendered similar to those of the longitudinal grooves 16, 26, and longitudinal partition walls 17, 27, described in the first embodiment with reference to FIG. 2, so that the transverse grooves 46 in one of the grooved integrated blocks, and the transverse partition walls 47 in the other of the grooved integrated blocks can be fitted to each other. That is, in the grooved integrated blocks 43A, 43B, shown in FIG. 15, the transverse grooves 46 are formed at a same pitch, and the width of the respective transverse grooves 46 is rendered wider than that of the respective transverse partition walls 47.

Figure 16:
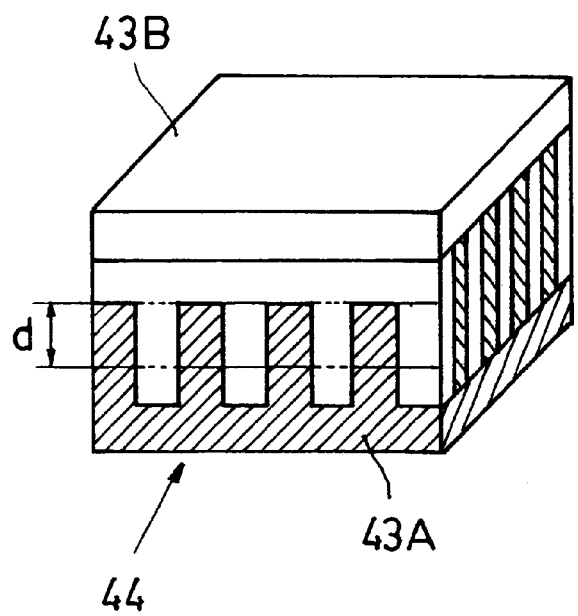

Subsequently, as shown in FIG. 16, by applying a second fitting process whereby the pair of grooved integrated blocks 43A, 43B are combined with each other by fitting the respective transverse partition walls 47 into the respective transverse grooves 46, and further, by applying a second adhesion process whereby the grooved integrated blocks fitted together are integrally adhered to each other by filling up gaps between fitting parts with an adhesive insulating material, the pair of the grooved integrated blocks are integrally joined together, forming a doubly integrated block 44.

Further, for fitting and adhering together the grooved integrated blocks 43A with 43B, the methods previously described in the first embodiment with reference to FIGS. 3, 7, and 8 are applied.

Thereafter, a process of exposing thermoelectric semiconductor pieces is applied to the doubly integrated block 44. That is, portions of the doubly integrated block 44, other than a depthwise portion denoted by d in FIG. 16, are removed by polishing or grinding the upper as well as under surfaces thereof so that the remainder is finished up, leaving intact regions where the longitudinal grooves 16, 26, the transverse grooves 46, the longitudinal partition walls 27, 17, and the transverse partition walls 47, composed of either of the n-type thermoelectric semiconductor and p-type thermoelectric semiconductor, are all fitted to each other. Thus, as shown in FIG. 17, a thermoelectric device block 50 wherein n-type thermoelectric semiconductor pieces 51 and p-type thermoelectric semiconductor pieces 52 are alternately arranged is fabricated.

Figure 17:
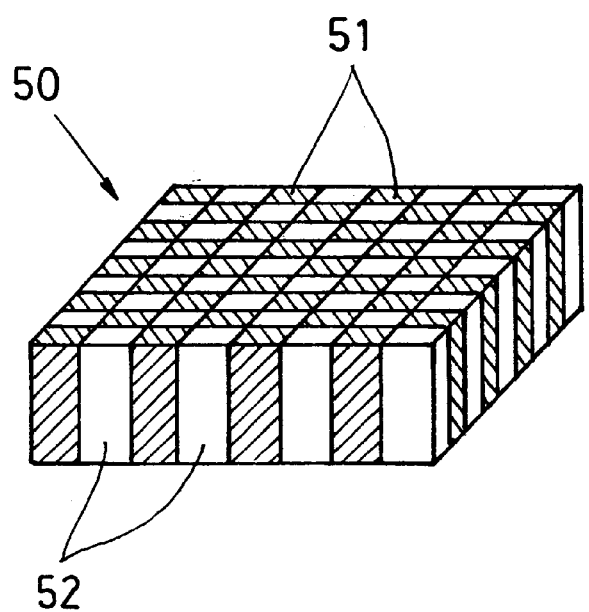

In integrally joining the grooved integrated blocks 43A with 43B in carrying out this embodiment, preferable fabrication conditions require that the n-type thermoelectric semiconductor pieces 51 and p-type thermoelectric semiconductor pieces 52 be arranged regularly like a checkerboard as shown in FIG. 17. Accordingly, respective positions thereof need to be aligned, which may be accomplished by providing a benchmark face on the periphery of each of the grooved integrated blocks, and joining the same together based on the benchmark face using a jig.

Figure 18:
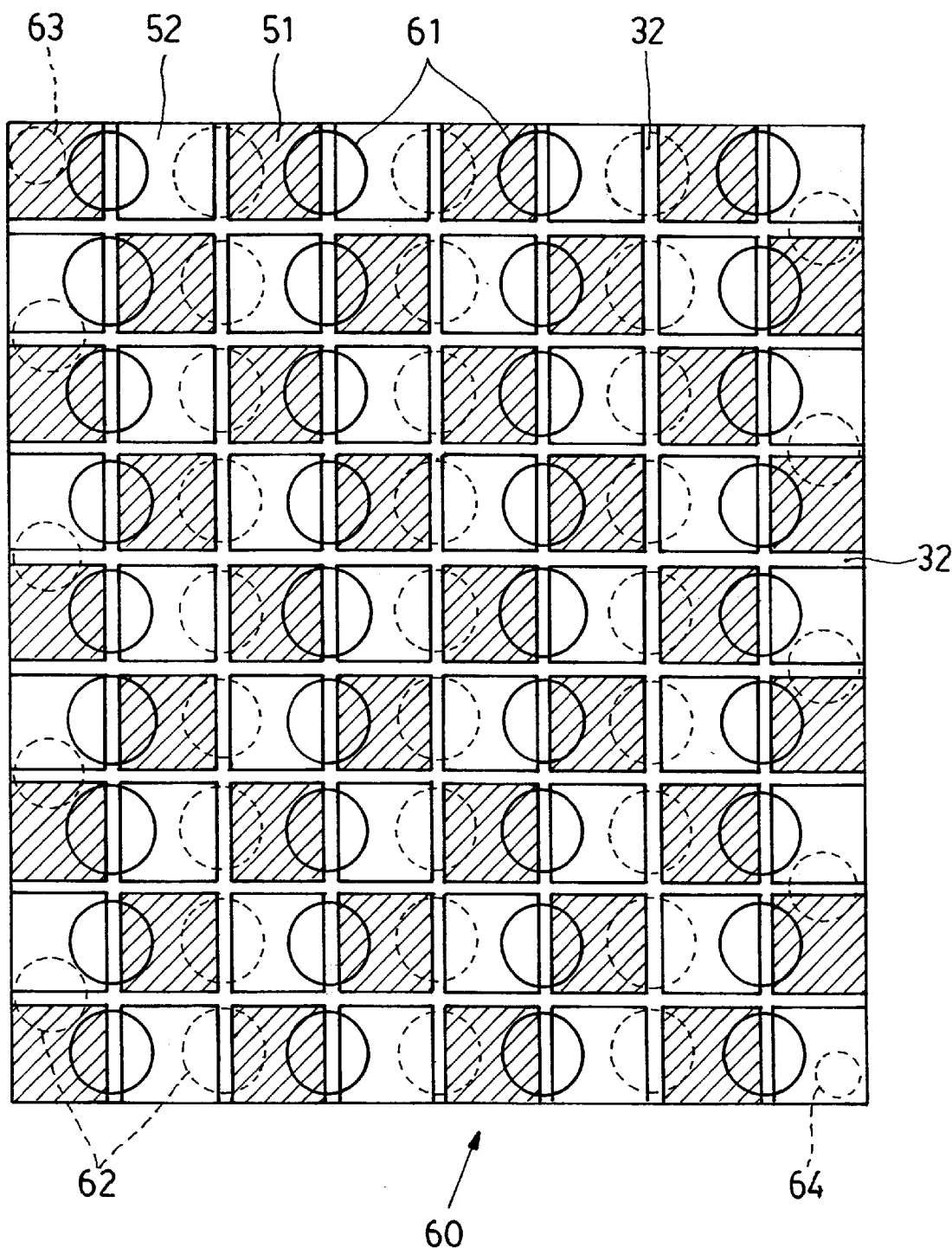
FIG. 18 is plan view of a completed thermoelectric device according to the third embodiment for explaining the construction of electrodes.

Such alignment in positioning will facilitate wiring work in a process of electrode wiring described hereinafter because of standardized and simplified shapes and layout of the electrodes as shown in FIG. 18. Furthermore, this will contribute to improvement in the utilization efficiency of the thermoelectric semiconductors because the thermoelectric semiconductor pieces located in the edge portions on the opposite sides in FIG. 9, not contributing to electrical connection in series, can be eliminated in this way.

Then, a process of forming electrodes is applied to the upper as well as under surfaces of the thermoelectric device block 50 such that the n-type thermoelectric semiconductor pieces 51 and p-type thermoelectric semiconductor pieces 52 are alternately and electrically connected with each other in series, thereby fabricating a thermoelectric device 60 shown in FIG. 18.

FIG. 18 is a plan view of the thermoelectric device 60, as seen directly from above, and respective electrodes are formed on both the upper surface and the under surface thereof.

Upper surface electrodes 61 circular in shape as indicated by the solid lines, formed on the upper surface of the thermoelectric device block 50 and under surface electrodes 62 circular in shape as indicated by the broken lines, formed on the under surface thereof are electrodes for connecting together the n-type thermoelectric semiconductor pieces 51 and p-type thermoelectric semiconductor pieces 52, adjacent to each other, in series, forming a plurality of thermocouples. Further, under surface electrodes 63, 64 are electrodes for outputting voltage externally.

Each of the electrodes denoted by 61 to 64 is formed by depositing a gold (Au) film on both the upper and under surfaces of the thermoelectric device block 50 shown in FIG. 17 by means of the vacuum coating method, sputtering method, electroless plating method, or the like, and then, by patterning on the gold film by use of the photolithographic technique and etching technique. Further, as a material for the electrodes, use can be made of not only gold film but also various other materials cited in the first embodiment described in the foregoing.

In the case where surface roughness of the upper and under surfaces of the thermoelectric device block 50, on which the electrodes 61 to 64 are formed, is likely to cause a problem as with the case of the first embodiment, it is desirable to render the surfaces smoother by lapping, or the like, as occurrence of faults with the electrodes (such as breakage) thereof is inhibited in this way.

Accordingly, the method according to the third embodiment of the invention has an advantage in that the upper surface electrodes 61b and under surface electrodes 62b formed in the shape resembling the letter L as shown in FIG. 9, which are required in the first and second embodiments, can be dispensed with, facilitating the wiring process and enabling effective use of the thermoelectric semiconductor material.

Further, with the thermoelectric device according to the third embodiment, the number of thermoelectric semiconductor pieces incorporated therein per unit volume thereof can be substantially doubled over that in the case of the first embodiment or the second embodiment so that a thermoelectric device smaller in size, but capable of outputting a higher voltage, will be obtained.

With the method according to the third embodiment, the side of the integrated block 3 shown in FIG. 3, on which the grooving process is applied, may be ground beforehand prior to forming the transverse grooves 46 as shown in FIG. 15 such that fitting parts between the longitudinal grooves 16, 26, and the longitudinal partition walls 17, 27, composed of the n-type thermoelectric semiconductor and p-type thermoelectric semiconductor, respectively, are exposed.

If the transverse grooves 46 are formed subsequently, all of the longitudinal grooves 16, 26, the transverse grooves 46, the longitudinal partition walls 17, 27, and the transverse partition walls 47, composed of the n-type thermoelectric semiconductor, and p-type thermoelectric semiconductor, respectively, are fitted together in their entirety when the second fitting process shown in FIG. 16 is applied. As a result, in the process of exposing the thermoelectric semiconductor pieces, the thermoelectric semiconductor pieces can be formed by leaving intact a portion of thermoelectric semiconductor material, corresponding to the full height of the longitudinal partition walls 17, 27 with the result that the utilization efficiency of the thermoelectric semiconductor material is enhanced.

Figure 19:
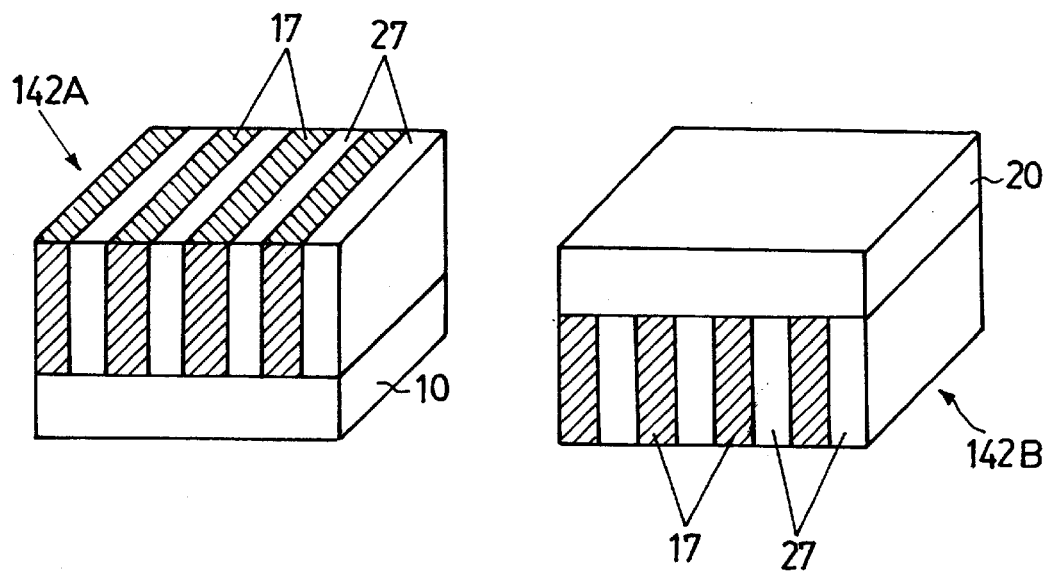
FIGS. 19 to 21 are perspective views showing parts of fabrication processes illustrating a fourth embodiment of a method of fabricating a thermoelectric device according to the invention.
Figure 20:
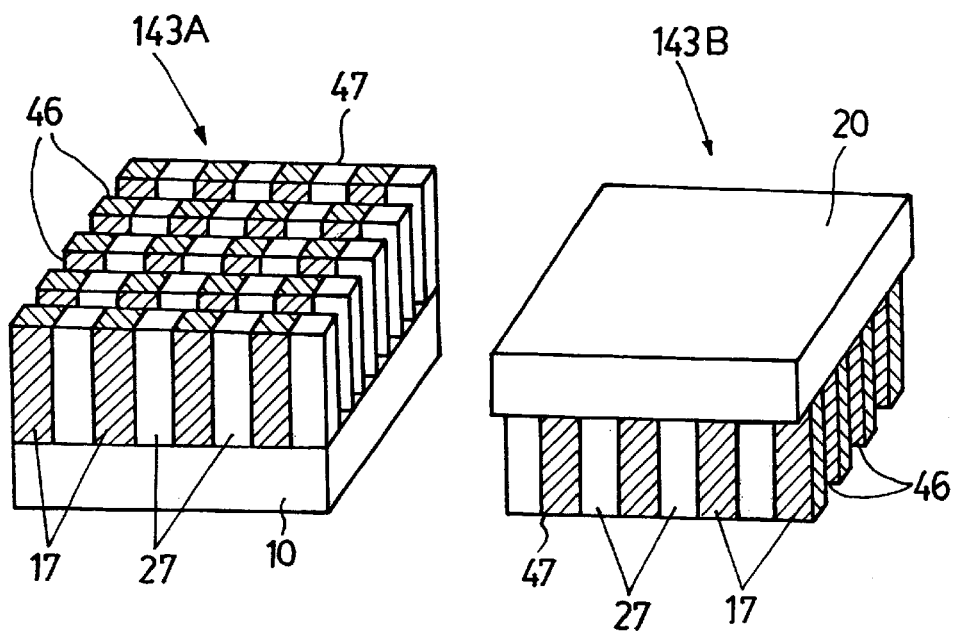
Figure 21:
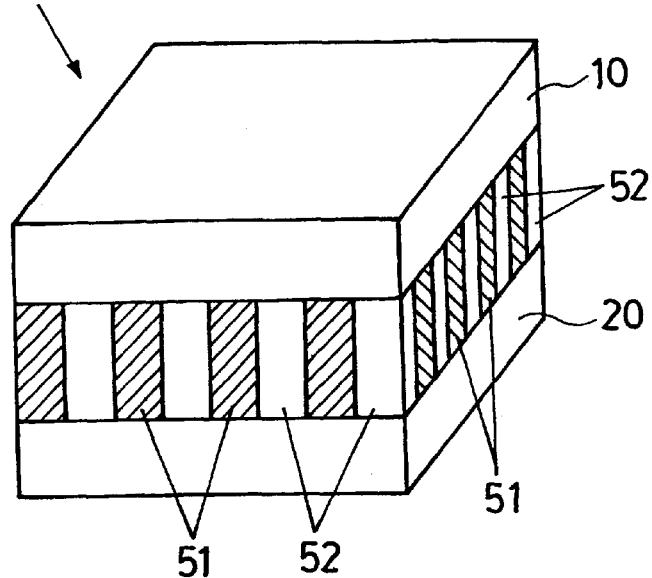

Fourth Embodiment: FIGS. 19 to 21

A fourth embodiment of a method of fabricating a thermoelectric device according to the invention is described hereinafter with reference to FIGS. 19 to 21. The first half of a process applied in carrying out the fourth embodiment is the same as for the second embodiment described with reference to FIGS. 10 to 12, and accordingly, will only be briefly described referring to these figures.

In the fourth embodiment, two each of n-type thermoelectric semiconductor composite blocks 12 formed by bonding the n-type thermoelectric semiconductor block 1 to the base 10, shown in FIG. 10, and p-type thermoelectric semiconductor composite blocks 22 formed by bonding the p-type thermoelectric semiconductor block 2 to the base 20, shown in FIG. 10, are prepared.

Then, a first grooving process is applied to the respective thermoelectric semiconductor composite blocks 12, 22, whereby a plurality of grooves at a same pitch are formed in the n-type thermoelectric semiconductor block 1, and the p-type thermoelectric semiconductor block 2, respectively, to a depth close to the interface between the thermoelectric semiconductor block 1, or 2 and the base 10 or 20 as shown in FIG. 11 such that longitudinal grooves 16, 26 as well as longitudinal partition walls 17, 27 are formed in a shape resembling the teeth of a comb. Thus, two pairs of n-type grooved composite blocks 13 and p-type grooved composite blocks 23 are fabricated. The positions of the respective longitudinal grooves 16 of the n-type grooved composite block 13 are preferably deviated from those of the corresponding longitudinal grooves 26 of the p-type grooved composite block 23 by a half of the pitch.

Subsequently, a first fitting process is applied to the two pairs of the n-type thermoelectric semiconductor composite blocks 13 and p-type thermoelectric semiconductor composite blocks 23, to which the grooving process described above has been applied, respectively, whereby respective grooved n-type thermoelectric semiconductor composite blocks 13 and respective grooved p-type thermoelectric semiconductor composite blocks 23 are fitted to each other such that grooved surfaces of each pair face each other, and then a first adhesion process is applied to the two pairs of the grooved n-type thermoelectric semiconductor composite blocks 13 and grooved p-type thermoelectric semiconductor composite blocks 23, fitted to each other through the first fitting process, whereby both blocks in each pair are adhered to each other by filling up gaps in fitting parts therebetween with an adhesive insulation member, thereby fabricating two integrated blocks 3' as shown in FIG. 12.

With one of the two integrated blocks 3', the base 20 on the side of the p-type thermoelectric semiconductor block is removed while with the other, the base 10 on the side of the n-type thermoelectric semiconductor block is removed, obtaining a pair of integrated blocks 142A, 142B, with the longitudinal partition walls 17 of the n-type thermoelectric semiconductor and the longitudinal partition walls 27 of the p-type thermoelectric semiconductor, exposed on either the upper surface or under surface thereof, respectively, as shown in FIG. 19.

Subsequently, a process, the same as the second grooving process described in the second embodiment described hereinbefore with reference to FIG. 13, is applied to the pair of the integrated blocks 142A, 142B, from the side where the base 10 or the base 20 is removed, whereby a plurality of grooves at a same pitch are formed in the direction crossing the direction in which the first grooving process has been applied (at right angles, in this embodiment) to a depth close to the interface between the respective thermoelectric semiconductor blocks and the base 20 or the base 10 which has not been removed, thereby fabricating two grooved integrated blocks 143A, 143B, with a plurality of transverse grooves 46 and transverse partition walls 47 formed therein. In this connection, it is preferable that the transverse grooves 46 in one of the grooved integrated blocks, e.g. 143A, are formed such that the positions thereof are deviated by a half of the pitch from those of the transverse grooves 46 formed in the other of the grooved integrated blocks, e.g. 143B.

Subsequently, by applying a second fitting process whereby the two grooved integrated blocks 143A, 143B are fitted to each other such that respective grooved surfaces face each other, and then a second adhesion process, whereby the two grooved integrated blocks 143A, 143B, thus fitted to each other, are adhered together by filling up gaps in fitting parts therebetween with an adhesive insulation member, a doubly integrated block 144 shown in FIG. 21 is fabricated.

In this case, similarly to the case of the third embodiment, the relative position of the n-type thermoelectric semiconductor pieces 51 and p-type thermoelectric semiconductor pieces 52 need to be controlled so as to be arranged like a checkerboard as shown in FIG. 17 when fitting the two grooved integrated blocks 143A, 143B to each other.

As described in the third embodiment, alignment of respective positions can be accomplished by providing a benchmark face on the periphery of each of the grooved integrated blocks. Further, in the fourth embodiment, precision alignment of the respective positions may be attained through direct observation of the respective n-type thermoelectric semiconductor pieces 51 and respective p-type thermoelectric semiconductor pieces 52 by use of a microscope if a transparent member such as glass, or the like is used for the bases 10 and 20.

Then, by removing the bases 10 and 20 from the doubly integrated block 144, a thermoelectric device block, the same as the thermoelectric device block 50 shown in FIG. 17 with reference to the third embodiment, is obtained. Subsequently, by providing electrodes as same as the electrodes 61 to 64 illustrated in FIG. 18, a thermoelectric device, the same as the thermoelectric device 60 shown in FIG. 18, is fabricated.

In this embodiment, before the second grooving process is applied to the two integrated blocks 3', the base 20 or 10 on the side where the process of forming the transverse grooves 46 are applied is removed from the respective integrated blocks 3' so that when the pair of the grooved integrated blocks 143A and 143B, with the transverse grooves 46 formed therein, are fitted to each other, the thermoelectric semiconductors as a whole can be fitted to each other, enabling all thermoelectric semiconductors left intact to be put to use for the thermoelectric semiconductor pieces without any wastage thereof.

However, since such a step of processing is not essential, the base 10 or the base 20 may be removed after the second grooving process (formation of the transverse grooves) has been applied instead of first removing the base 10 or the base 20.

Figure 22:
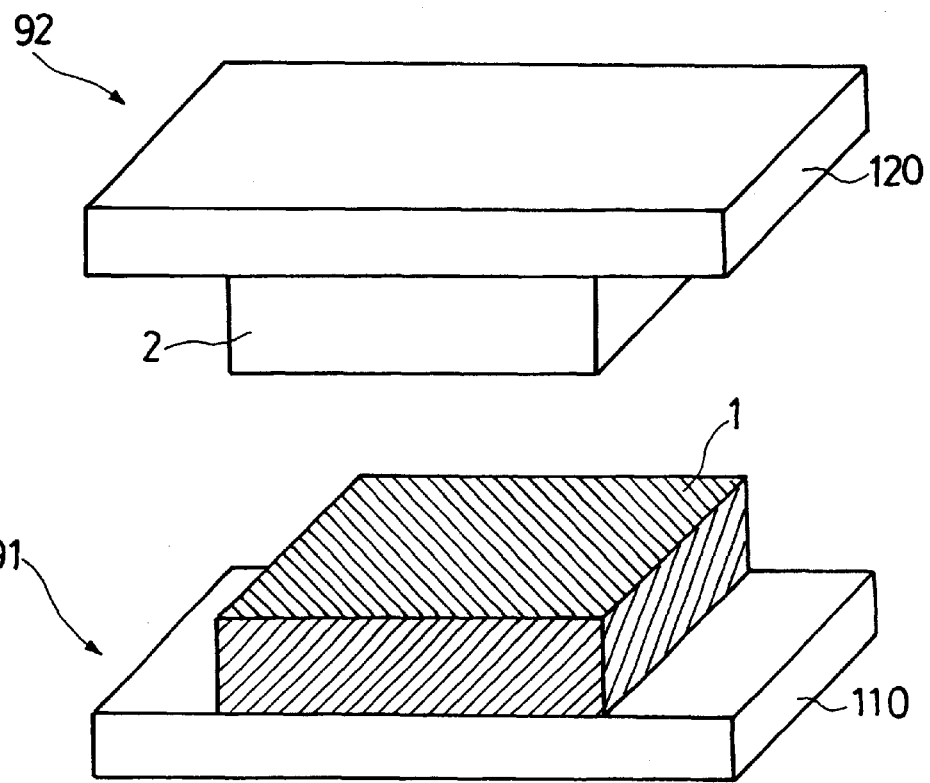
FIGS. 22 to 24 are perspective views showing the first half of fabrication processes illustrating a fifth embodiment of a method of fabricating a thermoelectric device according to the invention.
Figure 23:
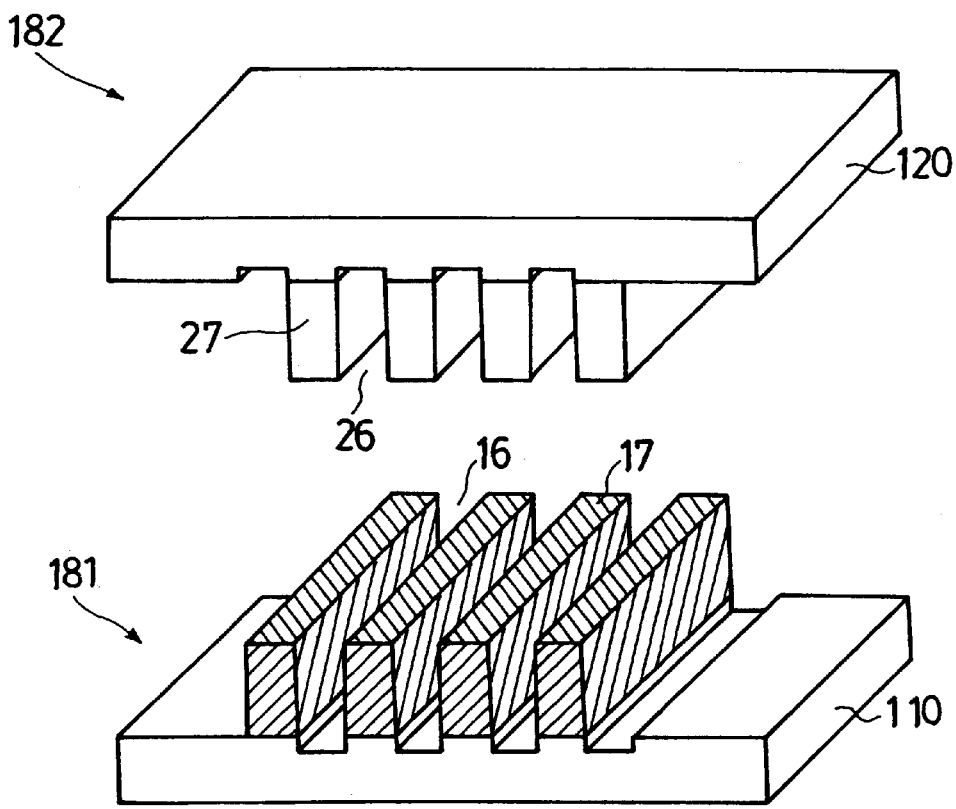
Figure 24:
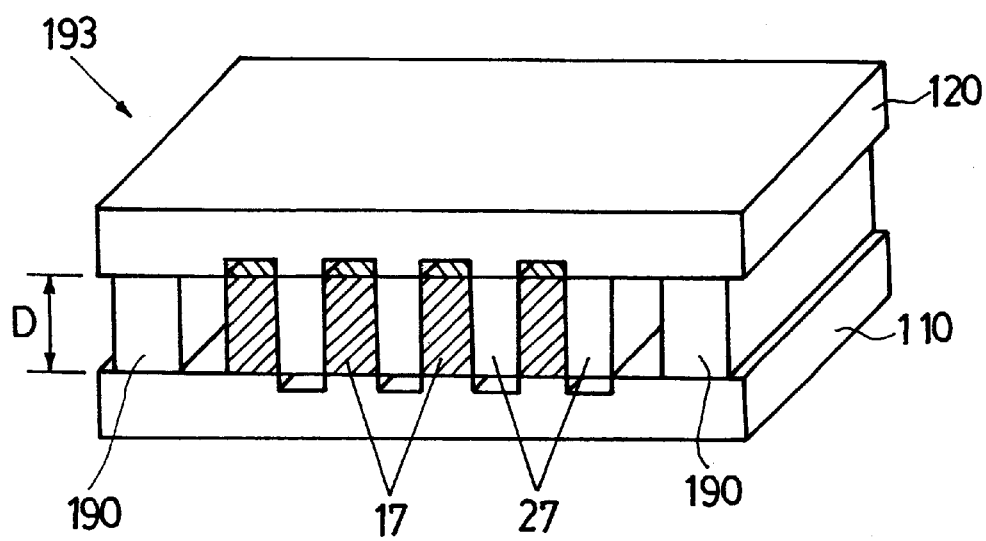

Fifth Embodiment: FIGS. 22 to 24

A fifth embodiment of a method of fabricating a thermoelectric device according to the invention is described hereinafter with reference to FIGS. 22 to 24.

In the method according to the fifth embodiment, an n-type thermoelectric semiconductor block 1 and a p-type thermoelectric semiconductor block 2 are bonded, respectively, to each of two large bases 110, 120 (hereinafter referred to as large bases), similarly to the case of the second embodiment, fabricating a pair of an n-type thermoelectric semiconductor composite block 91 and p-type thermoelectric semiconductor composite block 92.

More specifically, the large bases 110, 120 employed in carrying out this embodiment have a surface area larger than a bonded surface area of the respective thermoelectric semiconductor blocks 1, 2.

Similarly to the case of the second embodiment, longitudinal grooves 16, 26, and longitudinal partition walls 17, 27 are formed in the thermoelectric semiconductor blocks 1 and 2, respectively, by applying a first grooving process thereto, fabricating an n-type grooved composite block 181, and p-type grooved composite block 182 shown in FIG. 23. In this instance, the longitudinal grooves 16, 26 are preferably formed to a depth cutting into a portion of the large bases 110, 120, respectively. The reason for this is to make the most of the effect of spacers 190 in a fitting process described hereinafter with reference to FIG. 24 such that n-type as well as p-type thermoelectric semiconductors can be put to use efficiently.

Then, as shown in FIG. 24, a first fitting process is applied, whereby the n-type grooved composite block 181 and p-type grooved composite block 182, shown in FIG. 23, are combined to be fitted to each other. In this instance, by interposing the spacers 190 between the large bases 110 and 120, a spacing D between the two large bases 110 and 120 is controlled (restrained) accurately to match the height of the longitudinal partition walls 17, 27, composed of a thermoelectric semiconductor, corresponding to the thickness of the respective thermoelectric semiconductor blocks 1, 2.

For example, by equalizing the thickness of the n-type thermoelectric semiconductor block 1, p-type thermoelectric semiconductor block 2, and spacers 190, respectively, the spacing D between the two large bases 110 and 120 can be maintained at a given distance, enabling the longitudinal partition walls 17, 27, composed of the n-type and p-type thermoelectric semiconductors, respectively, to be arranged without unevenness in thickness.

That is, even in case there is no uniformity in the depth of the longitudinal grooves 16, 26, respectively, the n-type and p-type thermoelectric semiconductors can be arranged so as to have no unevenness in thickness with respect to each other by use of the spacers 190 with the result that wasteful polishing or grinding of the n-type and p-type thermoelectric semiconductors can be avoided, enabling improvement in utilization efficiency thereof.

After the first fitting process with the use of the spacers 190, the n-type grooved composite block 181 and p-type grooved composite block 182 are adhered to each other by filling up gaps in fitting parts therebetween with an adhesive insulation member, obtaining an integrated composite block 193 shown in FIG. 24.

Subsequently, a second grooving process is applied, fabricating a grooved integrated composite block with transverse grooves and transverse partition walls formed therein, similar to the grooved integrated block 14 shown in FIG. 13 with reference to the second embodiment, and insulating resin layers, the same as the insulating resin layers 54 shown in FIG. 14, are formed by filling up the respective transverse grooves with insulating resin, and by curing the insulating resin. Thereafter, by removing the large bases 110, 120, a thermoelectric device block, the same as the thermoelectric device block shown in FIG. 6, is obtained. Further, as shown in FIG. 9, by forming various electrodes on the upper as well as under surfaces of the thermoelectric device block, and connecting the respective thermoelectric semiconductor pieces with each other, alternately and in series, the thermoelectric device 6 can be fabricated.

Figure 25:
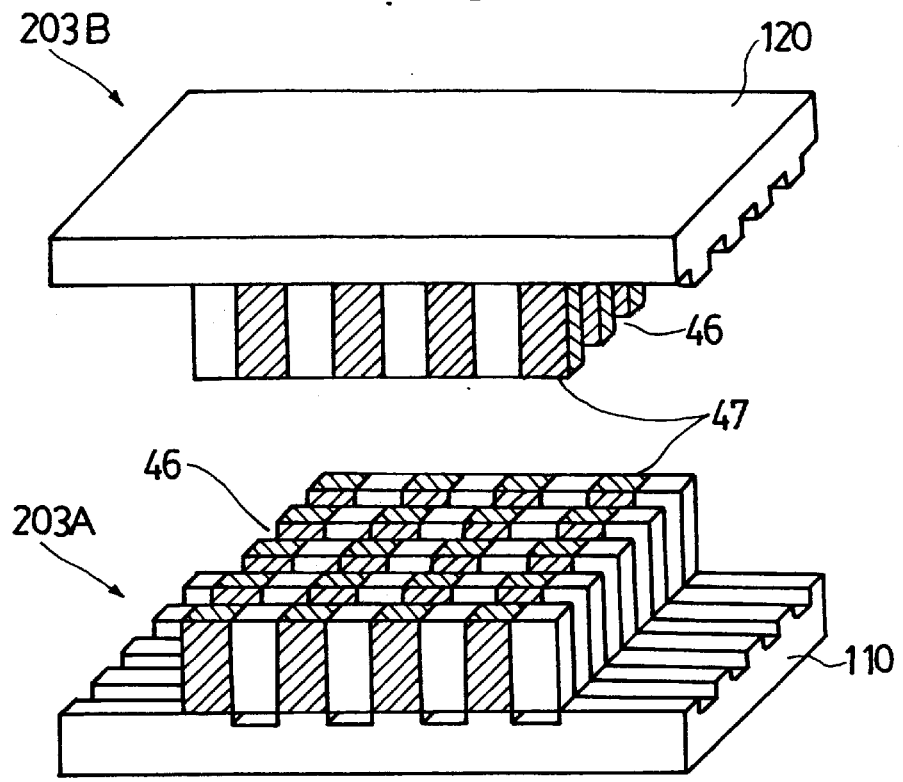
FIGS. 25 to 26 are perspective views showing parts of fabrication processes illustrating a sixth embodiment of a method of fabricating a thermoelectric device according to the invention.
Figure 26:
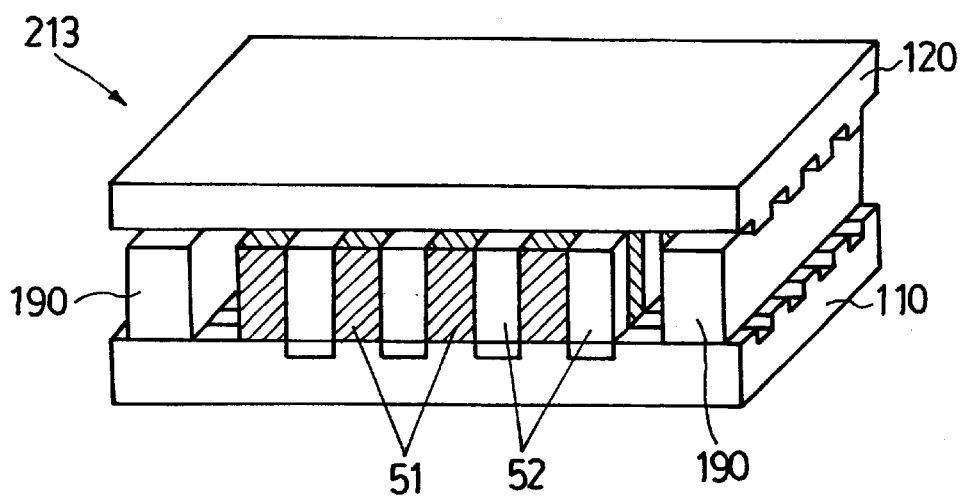

Sixth Embodiment: FIGS. 25 and 26

Next, a sixth embodiment of the method of fabricating a thermoelectric device according to the invention using the integrated composite blocks described in carrying out the fifth embodiment is described hereinafter with reference to FIGS. 25 and 26.

In the method according to the sixth embodiment, two integrated composite blocks 193 are fabricated by means of processes, the same as the respective processes described in the fifth embodiment with reference to FIGS. 22 to 24.

Subsequently, a second grooving process (formation of transverse grooves) is applied to the two integrated composite blocks 193, respectively, whereby a large base 110 or 120, on the side where the second grooving process is applied, is removed in a manner similar to the process as applied in the fourth embodiment described with reference to FIG. 19, fabricating a pair of grooved integrated composite blocks 203A, 203B as shown in FIG. 25, provided with a plurality of transverse grooves 46 as well as transverse partition walls 47 formed therein, respectively, so as to be fitted to each other.

Thereafter, the pair of grooved integrated composite blocks 203A and 203B are fitted to each other while maintaining a spacing between the large bases 110 and 120 at a given distance (a value equivalent to the height of the thermoelectric semiconductors left intact) with the use of spacers 190, and gaps in fitting parts therebetween are filled up with an adhesive insulation member, fabricating a doubly integrated block 213, as shown in FIG. 26.

Then, n-type and p-type thermoelectric semiconductor pieces 51, and 52 are exposed by removing the large bases 110, and 120 of the doubly integrated block 213, thereby obtaining a thermoelectric device block, the same as the thermoelectric device block shown in FIG. 17 with reference to the third embodiment.

Further, by forming electrodes 81 to 84 on the upper as well as under surfaces of the thermoelectric device block as shown in FIG. 18, and connecting respective thermoelectric semiconductor pieces 51, 52 with each other, alternately and in series, the thermoelectric device 60 can be fabricated.

Provided that the thermoelectric device 60 fabricated in the third, fourth, or sixth embodiment has dimensions of 10 mm×10 mm×2 mm after removing the peripheral region of the thermoelectric device block, 12 mm square, about 3400 couples of thermocouples can be integrated therein.

When a temperature difference of 1.50° C. was applied to the thermoelectric device 60, an output voltage at 2.0 V was obtained.

Thus, as the thermoelectric device 60 is small enough to be encased in a small portable electronic device such as a wrist watch and yet has an open circuit output voltage at a level high enough to drive a wrist watch, it is possible to drive various portable electronic devices with the thermoelectric device 60 in combination with a booster circuit.

Figure 27:
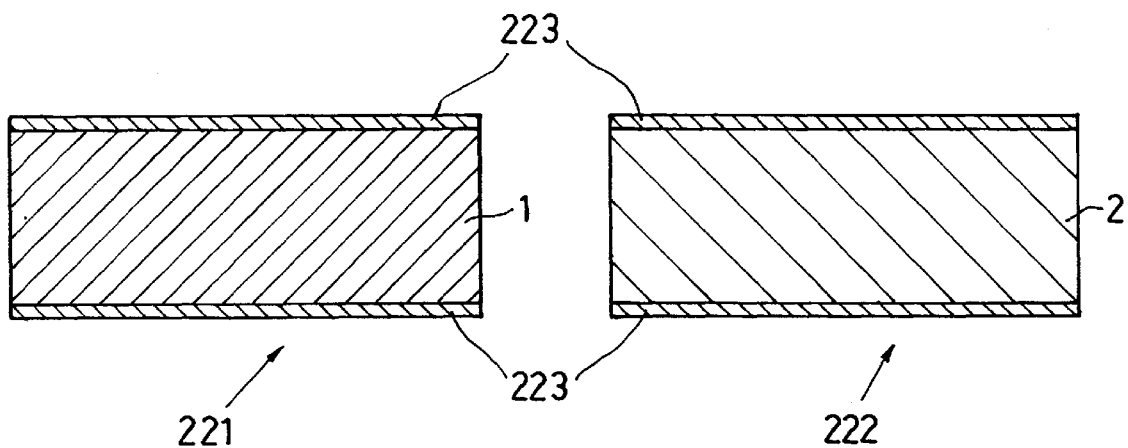
FIGS. 27 to 29 are sectional views showing parts of fabrication processes illustrating a seventh embodiment of a method of fabricating a thermoelectric device according to the invention.
Figure 28:
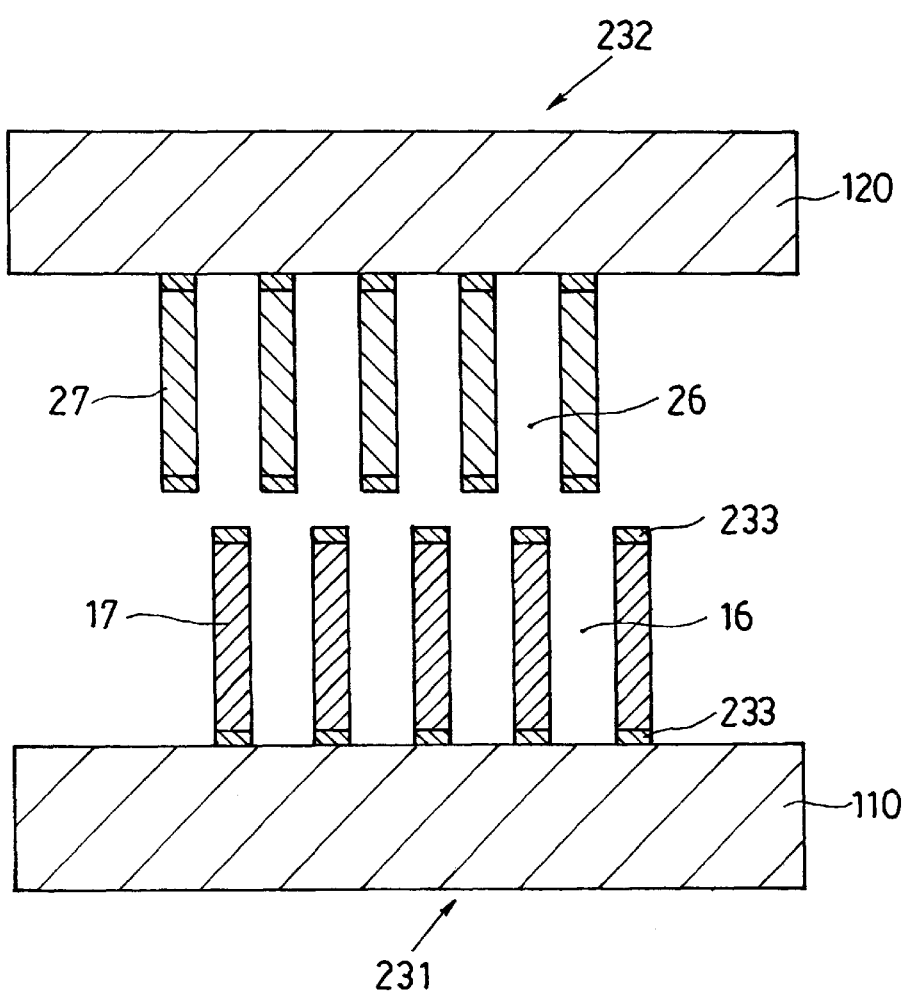
Figure 29:
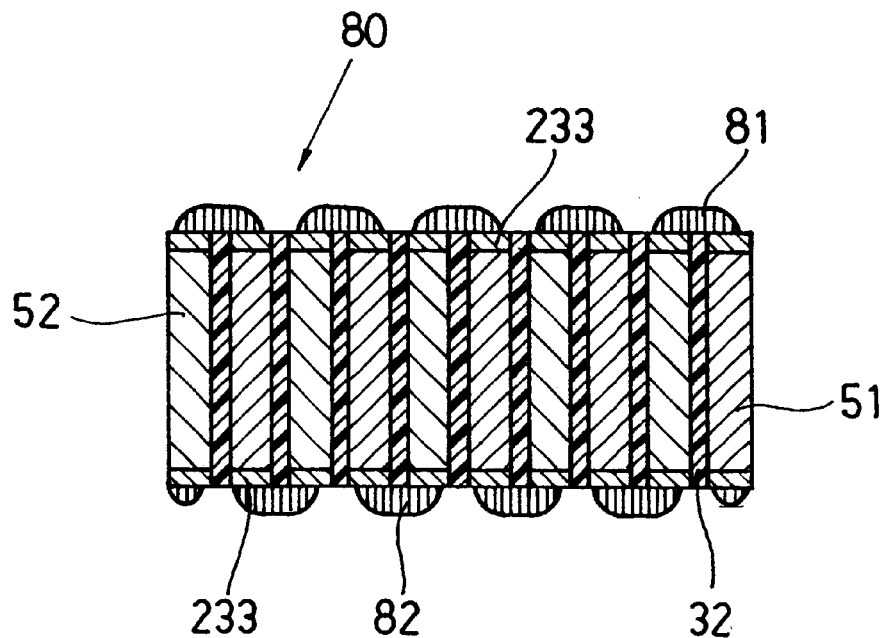

Seventh Embodiment: FIGS. 27 to 29

Next, a seventh embodiment of the method of fabricating a thermoelectric device according to the invention is described hereinafter with reference to FIGS. 27 to 29.

In the method according to the seventh embodiment of the invention, an n-type thermoelectric semiconductor block 1 and a p-type thermoelectric semiconductor block 2 as shown in FIG. 1 with reference to the first embodiment are first prepared, and as shown in FIG. 27, a metal coated layer 223 is formed on the surfaces of the respective thermoelectric semiconductor blocks 1, 2, that is, at least the surface bonded to a base, and the surface on the opposite side thereof (the surface on which electrodes are formed in a process of forming electrodes applied later on) by means of plating, vapor deposition, sputtering, or the like. Thus, a coated n-type thermoelectric semiconductor block 221, and coated p-type thermoelectric semiconductor block 222 are obtained.

The metal coated layer 223 is either a single layer composed of nickel (Ni), copper (Cu), gold (Au), or the like, or a composite layer composed of single layers stacked up. The metal coated layer 223 is provided in order to improve electrical connection between various wiring electrodes described hereinafter and thermoelectric semiconductors. It is desirable therefore to ensure ohmic contact between the metal coated layer 223 and the n-type thermoelectric semiconductor block 1, as well as the p-type thermoelectric semiconductor block 2, by applying proper heat treatment to the metal coated layer 223 when or after being formed.

The thickness of the metal coated layers 223 may be in the range of about 0.1 to 50 μm. However, in view of the possibility that the height of the coated n-type thermoelectric semiconductor block 221, and coated p-type thermoelectric semiconductor block 222, respectively, is made even by slightly removing portions of the surfaces of the metal coated layers 223 through a polishing process, or the like in a later step of processing, there will arise problems that if the metal coated layers 223 are excessively thin, it becomes difficult to apply treatment thereto due to too little allowance for polishing while if the same are excessively thick, this is prone to cause a stress-related problem. Accordingly, the thickness of the metal coated layers 223 is preferably in the range of 2 to 10 μm, and an electrolytic or electroless plating method is most suitable for forming a film in a thickness on this order.

In this embodiment, for the metal coated layer 223, a multilayered film composed of the Ni layer and Au layer, 5 μm in total thickness, is formed by the electrolytic plating method.

For the process shown in FIG. 27 and ones thereafter, any selected from the processes adopted in the second, fourth, fifth, and sixth embodiments can be applied. The seventh embodiment will be described on the assumption processes substantially similar to those applied in the fifth embodiment are adopted.

Accordingly, FIG. 28 corresponds to FIG. 23. That is, an n-type thermoelectric semiconductor composite block formed by bonding the coated n-type thermoelectric semiconductor block 221 to a large base 110, and a p-type thermoelectric semiconductor composite block formed by bonding the coated p-type thermoelectric semiconductor block 222 to a large base 120 are prepared, and longitudinal grooves 16, 26, and longitudinal partition walls 17, 27 are formed in the coated n-type and p-type thermoelectric semiconductor blocks, respectively, by means of the grinding process using a dicing saw, or the polishing process using a wire saw. As a result, a coated n-type grooved composite block 231, and coated p-type grooved composite block 232 are fabricated. In this instance, portions of the respective metal coated layers 223, at the upper or lower ends of the longitudinal partition walls 17, 27, are left intact as metal layers 233.

The coated n-type thermoelectric semiconductor block 221 and coated p-type thermoelectric semiconductor block 222 are bonded to the large base 110 and large base 120, respectively, by use of an adhesive or wax. Further, for the large bases 110 and 120, any material having a hardness to a given degree such as glass, ceramic, plastics, metal, or the like, may be employed.

The pitch at which the longitudinal grooves 16, 26 are formed, and the width and depth of the longitudinal grooves 16, 26 are substantially as described with reference to FIG. 23, except that the depth thereof somewhat differs. In this embodiment, the longitudinal grooves 16, 26 are formed to a depth either of the interface between the coated n-type thermoelectric semiconductor block 221 and the large base 110 or between the coated p-type thermoelectric semiconductor block 222 and the large base 120, or so as to be cut into the large base 110 or 120.

The reason for this is that in carrying out a process of combining the coated n-type grooved composite block 231 with the coated p-type grooved composite block 232, the surfaces of the metal layers 233 of the respective coated grooved composite blocks are rendered to be flush with each other.

Subsequently, as described in the fifth embodiment with reference to FIG. 24, the coated n-type grooved composite block 231 and coated p-type grooved composite block 232 are combined to be fitted to each other, and gaps in fitting parts therebetween are filled with adhesive insulation members, forming adhesion layers 32 shown in FIG. 29, so that an integrated composite block is fabricated through adhesion of the coated grooved composite blocks with each other.

Thereafter, a second grooving process is applied to the integrated composite block, whereby a grooved integrated composite block with transverse grooves as well as transverse partition walls formed therein is formed, and by filling up the respective transverse grooves with insulating resin and curing the same, insulating resin layers, the same as the insulating resin layers 54 shown in FIG. 5, are formed.

After removing the large bases 110, 120, a thermoelectric device block 5 as shown in FIG. 6 is obtained. Further, by forming respective electrodes 81, 82, as shown in FIG. 29, on both the upper and under surfaces of the thermoelectric device block, and connecting n-type thermoelectric semiconductor pieces 51 and p-type thermoelectric semiconductor pieces 52 to each other, alternately and in series, a thermoelectric device 80 can be fabricated.

FIG. 29 illustrates the sectional shape of the thermoelectric device 80 according to the seventh embodiment of the invention, corresponding to the plan view shown in FIGS. 9 and 18, respectively. In this connection, for forming the upper surface electrode 81 and the under surface electrode 82, the vapor deposition film described hereinbefore is normally used. However, the method according to this embodiment may be characterized by use of an electrically conductive paste such as silver paste.

Electrical connection between the electrically conductive paste and such semiconductor as used in the method of the invention is generally prone to create a problem due to high contact resistance. Therefore, with the construction according to the invention, the electrically conductive paste is not suitable for use for wiring electrodes. However, by providing the metal layer 233 shown in the seventh embodiment, the contact resistance described can be reduced to a negligible level. Consequently, the electrically conductive paste can be used for the upper surface electrode 81 and the under surface electrode 82.

The method according to this embodiment has an advantage in that productivity is remarkably improved because with the use of the electrically conductive paste, the electrodes can be formed through patterning by use of a screen printing method.

Figure 30:
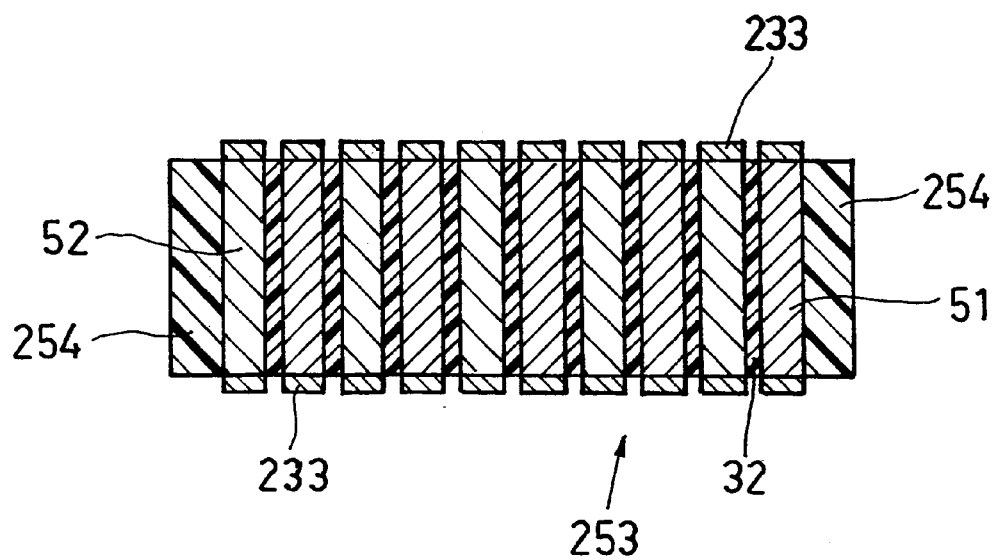
FIGS. 30 and 31 are sectional views showing parts of fabrication processes illustrating an eighth embodiment of a method of fabricating a thermoelectric device according to the invention.
Figure 31:
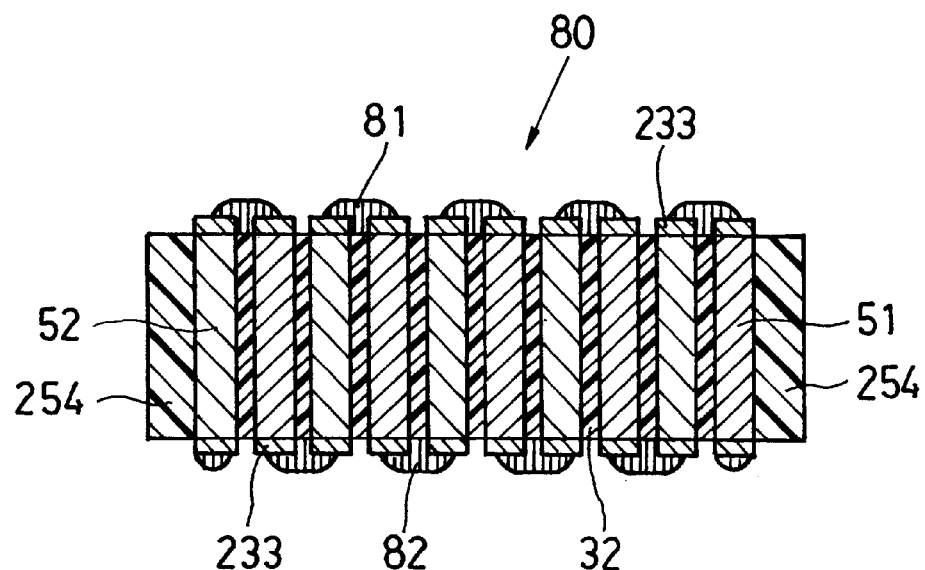

Eighth Embodiment: FIGS. 30 and 31

Next, an eighth embodiment of the method of fabricating a thermoelectric device according to the invention is described hereinafter with reference to FIGS. 30 and 31.

The method according to the eighth embodiment is described starting from the stage of a thermoelectric device block (for example, the same as the thermoelectric device block 5 shown in FIG. 6) prior to the wiring process described in the first to the fifth embodiments. That is, respective processes applied up to this stage in this embodiment are the same as those in the case of the respective embodiments described above.

After the formation of the thermoelectric device block described above, metal layers 233, the same as in the case of the seventh embodiment, are formed on at least the surfaces of n-type thermoelectric semiconductor pieces 51 and p-type thermoelectric semiconductor pieces 52, where wiring electrodes are to be formed.

As a result, a thermoelectric device block 253 shown in FIG. 30 illustrating the sectional view thereof is fabricated.

In this embodiment, the metal layers 233 are preferably deposited by a plating method whereby a single-layered film composed of Ni, Au, Cu, or the like, or a multi-layered film composed of the aforesaid films, is formed. In particular, an electroless plating is most suitable whereby selective plating can be applied to exposed surfaces of the thermoelectric semiconductor pieces 51, 52, taking advantage of selectivity in the condensation coefficient of Pd (palladium) acting as a catalyst on the surfaces of the thermoelectric semiconductor pieces 51, 52, adhesive layers 32, and insulating resin layers 54.

Further, it is preferable not to form the metal layer 233 on the side aces of the thermoelectric semiconductor pieces on the periphery of the thermoelectric device block (for example, the thermoelectric device block 5 shown in FIG. 6) prior to the wiring process being applied thereto, which is the starting point of description of this embodiment. Hence, in this embodiment, a coated layer 254 composed of the same material as is used for the adhesive layers 32, or the insulating resin layers 54, is formed on the peripheral face (the side face) of the thermoelectric device block.

FIG. 31 shows a thermoelectric device 80, completed by forming upper surface electrodes 81 and under surface electrodes 82 on the thermoelectric device block 253 shown in FIG. 30 by use of the electrically conductive paste as described in the seventh embodiment.

The method according to this embodiment, whereby the metal layers 233 are formed at a later stage of processing, has still an advantage in that productivity is remarkably improved because the electrically conductive paste can be used as in the case of the seventh embodiment, and the electrodes can be formed through patterning by use of the screen printing method.

Figure 32:
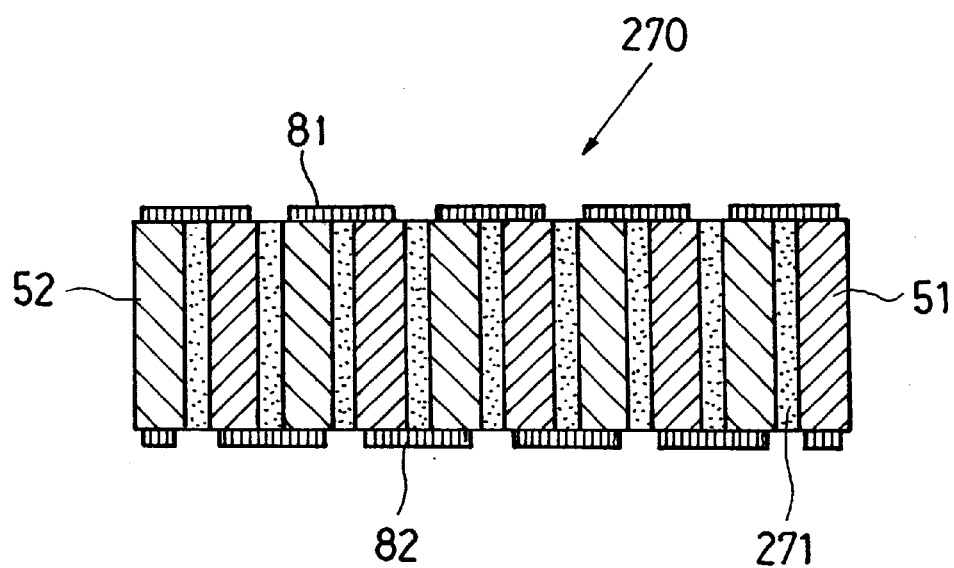
FIGS. 32 and 33 are sectional views showing parts of fabrication processes illustrating a ninth embodiment of a method of fabricating a thermoelectric device according to the invention.
Figure 33:
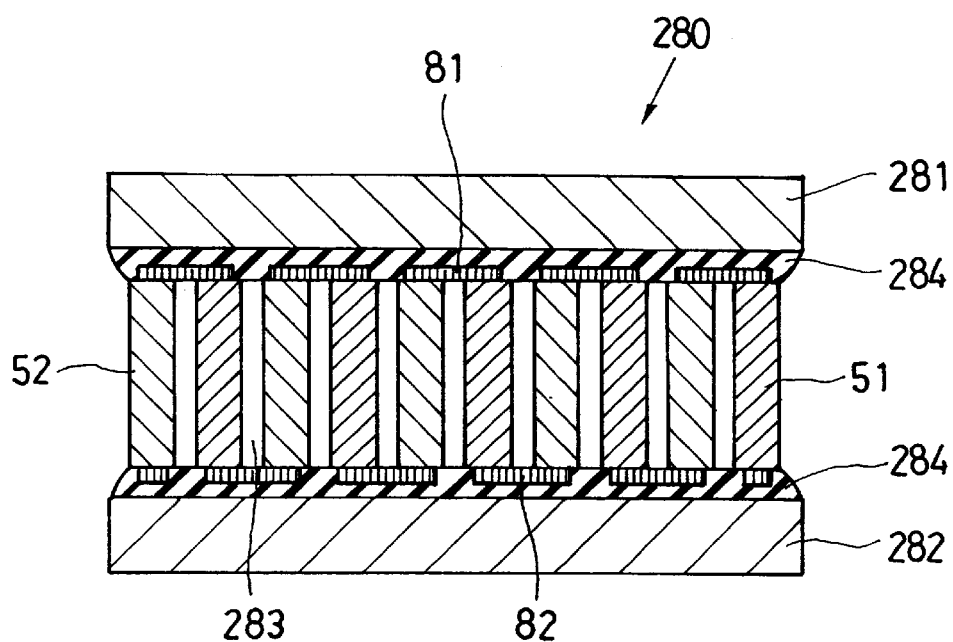

Ninth Embodiment: FIGS. 32 and 33

Next, a ninth embodiment of the method of fabricating a thermoelectric device according to the invention is described hereinafter with reference to FIGS. 32 and 33.

FIG. 32 shows a provisional thermoelectric device 270 fabricated according to the ninth embodiment, which is substantially the same as the thermoelectric device 6, 60, or 80 described in the respective embodiments described in the foregoing and fabricated by substantially the same processes except that in place of the adhesive layers 32, and the insulating resin layers 54, provisional fixture layers 271 are provided therein.

As opposed to the embodiments described in the foregoing, wherein the adhesive layers 32 and the insulating resin layers 54 are among the components of the thermoelectric device in the final form, the insulating resin layers 54 are not included in the components of the thermoelectric device in the final form in the case of the method according to the ninth embodiment.

Accordingly, in place of the adhesive layers 32 and the insulating resin layers 54, the provisional fixture layers 271 are formed for provisionally securing the n-type thermoelectric semiconductor pieces 51 and p-type thermoelectric semiconductor pieces 52, and are removed later on. The provisional fixture layers 271 are formed by filling up gaps in the fitting parts after the fitting process is applied to the pair of the grooved blocks or by filling up the transverse grooves 47 after being formed as shown in FIGS. 4, 13, and the like, with a provisional fixture material in the same way as for the formation of the adhesive layers 32, and the insulating resin layers 54. For the provisional fixture material, an adhesive material removable by heating or by use of a solvent such as wax is employed.

In the method of fabrication according to the ninth embodiment, an adhesive resin such as epoxy resin is applied as shown in FIG. 33 to the entire upper as well as under surfaces of the provisional thermoelectric device 270 shown in FIG. 32, thereby forming insulating fixture layers 284. The provisional thermoelectric device 270 is then sandwiched between a heat radiation plate 281 and a heat absorption plate 282, and fixedly attached thereto via the insulating fixture layers 284 integrally formed.

For the heat radiation plate 281 and heat absorption pate 282, a material having high thermal conductivity, that is, a metal or ceramic, is used.

Particularly in the case of a metal being selected for this purpose, a treatment to form an insulating oxide film may preferably be applied to the surface of the metal because of the risk of an accidental short circuit occurring between upper surface electrodes 81 and the heat radiation plate 281, or between under surface electrodes 82 and the heat absorption plate 282 if the insulating fixture layers 284 is rendered too thin.

Thereafter, as shown in FIG. 33, after securing the provisional thermoelectric device 270 onto the heat radiation plate 281 and heat absorption plate 282, the provisional fixture layers 271 are removed by use of heat or a solvent, thereby fabricating a thermoelectric device 280 provided with voids 283 created in regions vacated as above.

With the construction of the thermoelectric device 280 according to this embodiment, heat conduction by materials other than the thermoelectric semiconductors between the heat radiation plate 281 and the heat absorption plate 282 is largely inhibited because of the very low thermal conductivity of the air in the voids 283, enhancing the performance of the thermoelectric device.

In the aforesaid embodiment, in place of both the adhesive layers 32 provided in the fitting parts between the n-type and p-type thermoelectric semiconductor grooved blocks and the insulating resin layers 54 provided in the transverse grooves formed after the pair of the grooved blocks are integrated, the provisional fixture layers 271 are provided. However, only either of the adhesive layers or the insulating resin layers may be substituted by the provisional fixture layers 271, and after sandwiching the provisional thermoelectric device 270 between the heat radiation plate 281 and heat absorption plate 282 so as to be integrally secured by the insulating fixture layers 284, the provisional fixture layers 271 may be removed so that either the adhesive layers 32 or the insulating resin layers 54 are left intact.

This will enable the thermoelectric device to maintain sufficient strength while enhancing the performance thereof.

With the thermoelectric device 280 shown in FIG. 33, when used for generation of power, the heat absorption plate 282 is positioned on the lower temperature side.

Figure 34:
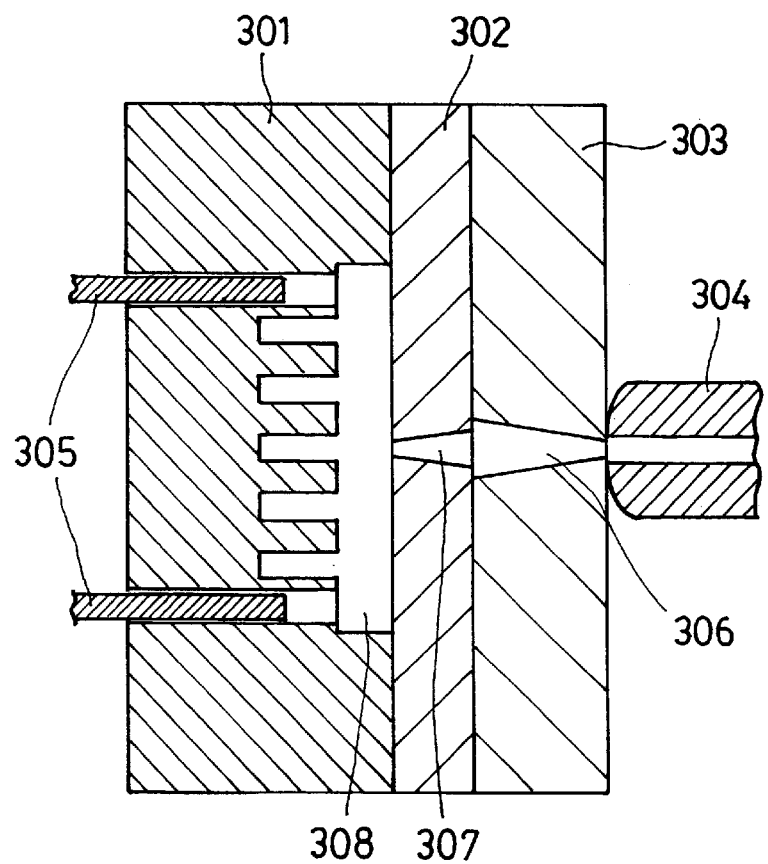
FIG. 34 is a sectional view showing an example of a mold used in forming a grooved block of thermoelectric semiconductor by means of injection molding.

Another Embodiment of a Process of Fabricating a Thermoelectric Semiconductor Grooved Block: FIG. 34

Now, another embodiment of a process of fabricating a thermoelectric semiconductor grooved block according to the invention is described hereinafter with reference to FIG. 34.

With the first embodiment or the third embodiment described hereinbefore, in the process of fabricating the n-type and p-type thermoelectric semiconductor grooved blocks, the plurality of grooves parallel with each other are formed in the n-type and p-type thermoelectric semiconductor blocks 1 and 2, respectively, by machining using the wire saw or the like, thereby fabricating the n-type thermoelectric semiconductor grooved block 11 and p-type thermoelectric semiconductor grooved block 21.

However, the n-type thermoelectric semiconductor grooved block 11 and p-type thermoelectric semiconductor grooved block 21 can also be fabricated by molding n-type thermoelectric semiconductor material and p-type thermoelectric semiconductor material separately into a mold (metal mold) for the grooved block, and then sintering the molded materials.

In such a process of fabricating the grooved blocks as described above, a compound used for injection molding is produced by adding a mixture as an organic binder, consisting of, for example, ethylene-vinyl-acetate-polybutylmethacrylate-polystyrene copolymer, atactic polypropylene, paraffin wax, and dibutyl phthalate to pulverized powders of a thermoelectric semiconductor material (for example, in the case of the p-type thermoelectric semiconductor material, pulverized powders of BiTeSb crystals as in the case of the first embodiment) on the order of 1 μm in average grain size, and kneading the same with the use of a pressurized kneader. A suitable mixing ratio of the pulverized powders to the organic binder is 5 to 15 wt parts of the organic binder against 100 wt parts of the pulverized powders.

The compound for injection molding thus produced is molded by use of an injection molding machine, and FIG. 34 is a sectional view of a metal mold with which molding is performed.

In this case, the compound for injection molding is pressurized and filled from a nozzle 304 into a molding cavity 308 formed in the shape of the grooved block inside a movable mold 301 via a sprue 306 of a fixed mold 303 and a gate 307 of an intermediate mold 302.

A molded body formed in the molding cavity 308 as described above is pushed out by ejector pins 305, and taken out after the movable block 301 is shifted and separated from the intermediate mold 302. The molding cavity 308 is designed to have dimensions about 20% larger than those of the grooved block to allow for shrinkage occurring to the molded body during the sintering thereof.

The molded bodies are then placed side by side on a flat plate made of alumina in a vacuum furnace at 400° C. for a retention time of 1 hour, obtaining provisional sintered bodies with organic binders substantially removed. In the final step, the provisional sintered bodies are again placed side by side on the flat plate made of alumina, and subjected to a sintering process at 470° C. for a duration of 3 hours in an electric furnace in a hydrogen-flow atmosphere, obtaining sintered bodies composed of the n-type or p-type thermoelectric semiconductors, respectively. The sintered bodies are the n-type grooved block 11, and p-type grooved block 21, respectively.

Supplementary Explanation

Various embodiments of the method of fabricating the thermoelectric device according to the invention have been described in the foregoing, and every one of the embodiments is based on the construction wherein the thermoelectric semiconductor pieces 51, 52 are all arranged in a matrix fashion. That is, all the embodiments have made a point of applying the process of forming the transverse grooves after the process of forming the longitudinal grooves, then the process of exposing the thermoelectric semiconductor pieces, and further, the process of forming the electrodes for wiring and the like, thus completing the fabrication of the thermoelectric device.

However, in the case where the thermocouples, even though small in number, can be effectively utilized, the thermoelectric device may be completed in the respective embodiments described hereinbefore by applying the process of exposing the thermoelectric semiconductor pieces without applying the process of forming the transverse grooves, and then, by forming the electrodes for wiring and the like.

In the case of adopting such steps of processing, the finished product will be the thermoelectric device of a construction wherein thin layers composed of n-type and p-type thermoelectric semiconductors, respectively, are alternately arranged and connected to each other in series.

It is obvious that the method of fabricating the thermoelectric device according to the invention is sufficiently effective for fabrication of the thermoelectric device having the construction described above.

As described in each of the aforesaid embodiments, the longitudinal grooves as well as the transverse grooves are formed by use of the wire saw or the dicing saw, and in the case that the grooving process is applied by a grinding method using the wire saw, the bottom surfaces of the longitudinal grooves as well as the transverse grooves become a circular arc in actual shape.

Although the longitudinal grooves have arc-shaped bottom surfaces while the longitudinal partition walls have rectangular top ends, there will arise no particular problem when the n-type grooved block is combined with the p-type grooved block to be fitted to each other because gaps formed are filled up with the adhesive.

Further, when the transverse grooves are formed by use of the wire saw after the integrated block has been formed, the bottom surfaces of the transverse grooves become a circular arc in shape. However, there will arise no problem in this case either, because the transverse grooves are filled up with the insulating resin.

As is evident from the foregoing description, in the method of fabricating the thermoelectric device according to the invention, the grooved blocks composed of the n-type and p-type thermoelectric semiconductors, respectively, are fabricated by applying a precision machining process to thermoelectric semiconductor members, or by applying a precision molding process to thermoelectric semiconductor material, and then, by applying an integration process of combining the grooved blocks so as to be fitted to each other, the thermoelectric semiconductor members can always be handled in the form of a unit (block). Hence, the thermoelectric device incorporating the thermocouples composed of a multitude of thermoelectric semiconductor pieces can be fabricated without applying processes such as a process of forming thermoelectric semiconductors into a thin sheet-like shape, a process of forming thermoelectric semiconductors into a kenzan-like shape by applying a fine grooving process, and the like wherein the thermoelectric semiconductor materials are susceptible to undergo breakage.

Accordingly, an ultra small thermoelectric device capable of outputting a high voltage can be fabricated easily and efficiently, making it possible to utilize power generated by temperature differences occurring in a portable electronic device such as a wrist watch.

INDUSTRIAL APPLICABILITY

With the method of fabricating a thermoelectric device according to the invention, a thermoelectric device small in size, incorporating a multitude of thermocouples formed therein, and capable of outputting a high voltage can be fabricated easily and efficiently. As a high output voltage can be produced by putting the thermoelectric device to use as a small thermoelectric generator, the thermoelectric device installed in a portable miniature electronic device such as a wrist watch and the like can be used as a power supply for electric power generated by temperature differences.

The thermoelectric device can also be used in fabrication of a high performance cooling system of small size, which is quite useful as a portable refrigerator, or a localized cooler for lasers, integrated circuits, and the like.

What is claimed is:

1. A method of fabricating a thermoelectric device comprising:
    a first grooving process applied to an n-type thermoelectric semiconductor composite block prepared by bonding an n-type thermoelectric semiconductor block to a base and a p-type thermoelectric semiconductor composite block prepared by bonding a p-type thermoelectric semiconductor block to a base, for forming a plurality of grooves in the n-type thermoelectric semiconductor block and the p-type thermoelectric semiconductor block, respectively, at a same pitch in only one direction, and to a depth close to the interface between the respective thermoelectric semiconductor blocks and the base thereof;
    a fitting process of fitting the n-type thermoelectric semiconductor composite block and p-type thermoelectric semiconductor composite block, with the grooves formed by said first grooving process, respectively, to each other such that respective grooved surfaces face each other;
    an adhesion process of forming an integrated block by filling gaps in fitting parts between the n-type thermoelectric semiconductor composite block and the p-type thermoelectric semiconductor composite block, fitted to each other by said fitting process, with adhesive insulation members so as to adhere the n-type thermoelectric semiconductor composite block and the p-type thermoelectric semiconductor composite block to each other;
    a second grooving process of forming a plurality of grooves in the direction crossing the direction of the grooves formed by said first grooving process, and to a depth close to the interface between the respective thermoelectric semiconductor blocks and the base thereof in the integrated block formed by said adhesion process;
    a solidification process of filling up the grooves formed by said second grooving process with insulation members, and solidifying the same; and
    a thermoelectric semiconductor pieces exposure process of exposing n-type and p-type thermoelectric semiconductor pieces by removing the respective bases of the integrated blocks wherein the grooves are filled with the insulation member and the insulation member is then solidified in said solidification process;
    characterized in that the bases of the n-type thermoelectric semiconductor composite block and the p-type thermoelectric semiconductor composite block, respectively, have a surface area larger than an area of a bonded portion of the surface of the respective thermoelectric semiconductor blocks, and in the fitting process, spacers are interposed between portions of the bases of the n-type thermoelectric semiconductor composite block and the p-type thermoelectric semiconductor composite block, respectively, where the respective thermoelectric semiconductor blocks do not exist, so that a spacing between the bases is controlled to be substantially equivalent to thickness of the respective thermoelectric semiconductor blocks.

2. A method of fabricating a thermoelectric device according to claim 1, further comprising an electrode forming process of forming electrodes for connecting the exposed n-type and p-type thermoelectric semiconductor pieces to each other alternately and in series, applied after the thermoelectric semiconductor pieces exposure process.

3. A method of fabricating a thermoelectric device according to claim 1, characterized in that before the n-type thermoelectric semiconductor block and the p-type thermoelectric semiconductor block are bonded to the bases, respectively, a metal coated layer is formed on the surface of the respective thermoelectric semiconductor blocks, bonded to the respective bases, and on the surface thereof on the opposite side.

4. A method of fabricating a thermoelectric device according to claim 3, further comprising an electrode formation process of forming electrodes for connecting the exposed n-type and p-type thermoelectric semiconductor pieces to each other alternately and in series by use of an electrically conductive paste applied on the metal coated layer after the thermoelectric semiconductor pieces exposure process.

5. A method of fabricating thermoelectric device comprising:
    a first grooving process applied to two n-type thermoelectric semiconductor composite blocks prepared by bonding an n-type thermoelectric semiconductor block to a base, respectively, and two p-type thermoelectric semiconductor composite blocks prepared by bonding a p-type thermoelectric semiconductor block to a base, respectively, for forming a plurality of grooves at a same pitch, and to a depth close to the interface between the respective thermoelectric semiconductor blocks and the base thereof, in the n-type thermoelectric semiconductor block and the n-type thermoelectric semiconductor block, respectively;

a first fitting process of fitting the two pairs of the n-type thermoelectric semiconductor composite block and the p-type thermoelectric semiconductor composite block, with the grooves formed therein, respectively, by said first grooving process to each other, respectively, such that respective grooved surfaces face each other;

a first adhesion process of forming two integrated blocks by adhering the two pairs of the n-type thermoelectric semiconductor composite blocks and p-type thermoelectric semiconductor composite blocks to each other, respectively, by filling gaps in fitting parts between the respective n-type thermoelectric semiconductor composite blocks and p-type thermoelectric semiconductor composite blocks, fitted to each other by said first fitting process, with adhesive insulation members;

a second grooving process of forming two grooved integrated blocks by forming a plurality of grooves at a same pitch in the two integrated blocks formed, respectively, by said first adhesion process, in the direction crossing the direction of the grooves formed by said first grooving process, and to a depth close to an interface between the respective thermoelectric semiconductor blocks and the base thereof;

a second fitting process of fitting the two grooved integrated blocks to each other such that respective grooved surfaces face each other;

a second adhesion process of forming a second integrated block by adhering the two grooved integrated blocks, fitted to each other by said second fitting process, to each by filling gaps in fitting parts between the two grooved integrated blocks with adhesive insulation members; and a thermoelectric semiconductor pieces exposure process of exposing n-type and p-type thermoelectric semiconductor pieces by removing the respective bases of the second integrated block;

characterized in the bases having a surface area larger than an area of a bonded portion of the surface of the respective thermoelectric semiconductor blocks are used for the base of the n-type thermoelectric semiconductor composite block and the p-type thermoelectric semiconductor composite block, respectively, and spacers are interposed between portions of the respective basis of the n-type thermoelectric semiconductor composite block and the p-type thermoelectric semiconductor composite block to be fitted to each other, where the respective thermoelectric semiconductor blocks do not exist, controlling a spacing between the bases to be substantially equivalent to thicknesses of the respective thermoelectric semiconductor blocks in the first fitting process, spacers being further interposed between portions of the respective basis of the two integrated grooved blocks to be fitted to each other, where the respective thermoelectric semiconductor blocks do not exist, controlling a spacing between the bases to be substantially equivalent to the thickness of the respective thermoelectric semiconductor blocks in the second fitting process.

6. A method of fabricating a thermoelectric device according to claim 5, further comprising an electrode forming process of forming electrodes for connecting the exposed n-type and p-type thermoelectric semiconductor pieces to each other alternately and in series, applied after the thermoelectric semiconductor pieces exposure process.

7. A method of fabricating a thermoelectric device according to claim 5, characterized in that before the n-type thermoelectric semiconductor block and the p-type thermoelectric semiconductor block are bonded to the bases, respectively, a metal coated layer is formed on the surface of the respective thermoelectric semiconductor blocks, bonded to the respective bases, and on the surface thereof on the opposite side.

8. A method of fabricating a thermoelectric device according to claim 7, further comprising an electrode formation process of forming electrodes for connecting the exposed n-type and p-type thermoelectric semiconductor pieces to each other alternately and in series by use of an electrically conductive paste applied on the metal coated layer after the thermoelectric semiconductor pieces exposure process.

9. A method of fabricating a thermoelectric device, comprising:

a grooved block fabrication process of forming grooved blocks composed of an n-type thermoelectric semiconductor and p-type thermoelectric semiconductor, respectively, each provided with a plurality of grooves formed at a same pitch and parallel with each other, leaving a depthwise portion of respective grooved blocks intact;

a fitting process of fitting the grooved blocks composed of the n-type thermoelectric semiconductor and p-type thermoelectric semiconductor formed, respectively, by said grooved block fabrication process to each other such that surfaces of the respective grooved blocks, with the grooves formed thereon, face each other;

an adhesion process of forming an integrated block by adhering the grooved block composed of the n-type thermoelectric semiconductor and the grooved block composed of the p-type thermoelectric semiconductor, fitted to each other by said fitting process, to each other after filling up gaps in fitting parts between the respective grooved blocks with an adhesive insulation member; and a thermoelectric semiconductor pieces exposure process of exposing n-type and p-type thermoelectric semiconductor pieces by removing all portions of the integrated block formed by said adhesion process, other than the fitting parts where the grooved block composed of the n-type thermoelectric semiconductor and the grooved block composed of the p-type thermoelectric semiconductor are fitted to each other;

characterized in that the insulation member for filling up the gaps in the fitting parts in the adhesion process is an adhesive insulation member with insulating spacers dispersed therein.

10. A method of fabricating a thermoelectric device comprising:

a grooved block fabrication process of forming grooved blocks composed of an n-type thermoelectric semiconductor and a p-type thermoelectric semiconductor, respectively, each provided with a plurality of grooves formed at a same pitch and parallel with each other in only one direction, leaving a depthwise portion of respective grooved blocks intact;

a fitting process of fitting the grooved blocks composed of the n-type thermoelectric semiconductor and the p-type thermoelectric semiconductor formed, respectively, by said grooved block fabrication process to each other such that surfaces of the respective grooved blocks, with the grooves formed thereon, face each other;

an adhesion process of forming an integrated block by adhering the grooved block composed of the n-type thermoelectric semiconductor and the grooved block composed of the p-type thermoelectric semiconductor, fitted to each other by said fitting process, to each other after filling up gaps in fitting parts between the respective grooved blocks with an adhesive insulation member;

a second grooving process of forming a plurality of grooves in the integrated block formed by said adhesion process, in the direction crossing the direction of the grooves formed by said grooved block fabrication process, leaving a depthwise portion of the integrated block intact;

a solidification process of filling up the grooves formed by said second grooving process with an adhesive insulation member and solidifying the same; and a thermoelectric semiconductor pieces exposure process of exposing n-type and p-type thermoelectric semiconductor pieces by removing all portions of the integrated block wherein the adhesive insulation member filling up the grooves is solidified in said solidification process, other than the fitting parts where the grooved block composed of the n-type thermoelectric semiconductor and the grooved block composed of the p-type thermoelectric semiconductor are fitted to each other;

characterized in that the insulation member for filling up the gaps in the fitting parts in the adhesion process is an adhesive insulation member with insulating spacers dispersed therein.

11. A method of fabricating a thermoelectric device comprising:

a first grooving process applied to an n-type thermoelectric semiconductor composite block prepared by bonding an n-type thermoelectric semiconductor block to a base and a p-type thermoelectric semiconductor composite block prepared by bonding a p-type thermoelectric semiconductor block to a base, for forming a plurality of grooves in the n-type thermoelectric semiconductor block and the p-type thermoelectric semiconductor block, respectively, at a same pitch in only one direction, and to a depth close to the interface between the respective thermoelectric semiconductor blocks and the base thereof;

a fitting process of fitting the n-type thermoelectric semiconductor composite block and p-type thermoelectric semiconductor composite block, with the grooves formed by said first grooving process, respectively, to each other such that respective grooved surfaces face each other;

an adhesion process of forming an integrated block by filling gaps in fitting parts between the n-type thermoelectric semiconductor composite block and the p-type thermoelectric semiconductor composite block, fitted to each other by said fitting process, with adhesive insulation members so as to adhere the n-type thermoelectric semiconductor composite block and the p-type thermoelectric semiconductor composite block to each other;

a second grooving process of forming a plurality of grooves in the direction crossing the direction of the grooves formed by said first grooving process, and to a depth close to the interface between the respective thermoelectric semiconductor blocks and the base thereof in the integrated block formed by said adhesion process;

a solidification process of filling up the grooves formed by said second grooving process with insulation members, and solidifying the same; and a thermoelectric semiconductor pieces exposure process of exposing n-type and p-type thermoelectric semiconductor pieces by removing the respective bases of the integrated blocks wherein the grooves are filled with the insulation member and the insulation member is then solidified in said solidification process;

characterized in that the insulation member for filling up the gaps in the fitting parts in the adhesion process is an adhesive insulation member with insulating spacers dispersed therein.

12. A method of fabricating a thermoelectric device comprising:

a grooved block fabrication process of forming two pairs of grooved blocks composed of an n-type thermoelectric semiconductor and a p-type thermoelectric semiconductor, respectively, provided with a plurality of grooves formed at a same pitch and parallel with each other, respectively, leaving a depthwise portion of respective grooved blocks intact;

a first fitting process of fitting each pair of the grooved blocks composed of the n-type thermoelectric semiconductor and the grooved block of the p-type thermoelectric semiconductor, formed by said grooved block fabrication process, to each other such that surfaces with the grooves formed thereon face each other;

a first adhesion process of forming two integrated blocks by filling up gaps in fitting parts between each pair of the grooved blocks composed of the n-type thermoelectric semiconductor and the p-type thermoelectric semiconductor, respectively, fitted to each other by said first fitting process, with adhesive insulation members, and solidifying the same;

a grooving process of forming two grooved integrated blocks by forming in each of the two integrated blocks a plurality of grooves at a same pitch and in the direction crossing the direction of the grooves formed by said grooved block fabrication process, leaving a depthwise portion of respective integrated blocks intact;

a second fitting process of fitting the two grooved integrated blocks to each other such that surfaces with the grooves thus formed thereon face each other;

a second adhesion process of forming a second integrated block by filling gaps in fitting parts between the two grooved integrated blocks fitted to each other by said fitting process with adhesive insulation members, and solidifying the same; and a thermoelectric semiconductor pieces exposure process of exposing n-type and p-type thermoelectric semiconductor pieces by removing all depthwise portions of the second integrated block, other than the fitting parts;

characterized in that the insulation member for filling up the gaps in the fitting parts in at least either of the first adhesion process or the second adhesion process is an adhesive insulation member with insulating spacers dispersed therein.

13. A method of fabricating thermoelectric device comprising:

a first grooving process applied to two n-type thermoelectric semiconductor composite blocks prepared by bonding an n-type thermoelectric semiconductor block to a base, respectively, and two p-type thermoelectric semiconductor composite blocks prepared by bonding a p-type thermoelectric semiconductor block to a base, respectively, for forming a plurality of grooves at a same pitch, and to a depth close to the interface between the respective thermoelectric semiconductor blocks and the base thereof, in the n-type thermoelectric semiconductor block and the p-type thermoelectric semiconductor block, respectively;

a first fitting process of fitting the two pairs of the n-type thermoelectric semiconductor composite block and the p-type thermoelectric semiconductor composite block, with the grooves formed therein, respectively, by said first grooving process to each other, respectively, such that respective grooved surfaces face each other;

a first adhesion process of forming two integrated blocks by adhering the two pairs of the n-type thermoelectric semiconductor composite blocks and p-type thermoelectric semiconductor composite blocks to each other, respectively, by filling gaps in fitting parts between the respective n-type thermoelectric semiconductor composite blocks and p-type thermoelectric semiconductor composite blocks, fitted to each other by said first fitting process, with adhesive insulation members;

a second grooving process of forming two grooved integrated blocks by forming a plurality of grooves at a same pitch in the two integrated blocks formed, respectively, by said first adhesion process, in the direction crossing the direction of the grooves formed by said first grooving process, and to a depth close to an interface between the respective thermoelectric semiconductor blocks and the base thereof;

a second fitting process of fitting the two grooved integrated blocks to each other such that respective grooved surfaces face each other;

a second adhesion process of forming a second integrated block by adhering the two grooved integrated blocks, fitted to each other by said second fitting process, to each by filling in fitting parts between the two grooved integrated blocks with adhesive insulation members; and a thermoelectric semiconductor pieces exposure process of exposing n-type and p-type thermoelectric semiconductor pieces by removing the respective bases of the second integrated block;

characterized in that the insulation member for filling up the gaps in the fitting parts in at least either of the first adhesion process or the second adhesion process is an adhesive insulation member with insulating spacers dispersed therein.

14. A method of fabricating a thermoelectric device comprising:

a first grooving process applied to an n-type thermoelectric semiconductor composite block prepared by bonding an n-type thermoelectric semiconductor block to a base and a p-type thermoelectric semiconductor composite block prepared by bonding a p-type thermoelectric semiconductor block to a base, for forming a plurality of grooves in the n-type thermoelectric semiconductor block and the p-type thermoelectric semiconductor block, respectively, at a same pitch in only one direction, and to a depth close to the interface between the respective thermoelectric semiconductor blocks and the base thereof;

a fitting process of fitting the n-type thermoelectric semiconductor composite block and p-type thermoelectric semiconductor composite block, with the grooves formed by said first grooving process, respectively, to each other such that respective grooved surfaces face each other;

an adhesion process of forming an integrated block by filling gaps in fitting parts between the n-type thermoelectric semiconductor composite block and the p-type thermoelectric semiconductor composite block, fitted to each other by said fitting process, with adhesive insulation members so as to adhere the n-type thermoelectric semiconductor composite block and the p-type thermoelectric semiconductor composite block to each other;

a second grooving process of forming a plurality of grooves in the direction crossing the direction of the grooves formed by said first grooving process, and to a depth close to the interface between the respective thermoelectric semiconductor blocks and the base thereof in the integrated block formed by said adhesion process;

a solidification process of filling up the grooves formed by said second grooving process with insulation members, and solidifying the same; and a thermoelectric semiconductor pieces exposure process of exposing n-type and p-type thermoelectric semiconductor pieces by removing the respective bases of the integrated blocks wherein the grooves are filled with the insulation member and the insulation member is then solidified in said solidification process;

characterized in that before the n-type thermoelectric semiconductor block and the p-type thermoelectric semiconductor are bonded to the bases, respectively, a metal coated layer is formed on the surface of the respective thermoelectric semiconductor blocks, bonded to the respective bases, and on the surface thereof on the opposite side.

15. A method of fabricating a thermoelectric device according to claim 14, further comprising an electrode formation process of forming electrodes for connecting the exposed n-type and p-type thermoelectric semiconductor pieces to each other alternately and in series by use of an electrically conductive paste applied on the metal coated layer after the thermoelectric semiconductor pieces exposure process.

16. A method of fabricating thermoelectric device comprising:

a first grooving process applied to two n-type thermoelectric semiconductor composite blocks prepared by bonding an n-type thermoelectric semiconductor block to a base, respectively, and two p-type thermoelectric semiconductor composite blocks prepared by bonding a p-type thermoelectric semiconductor block to a base, respectively, for forming a plurality of grooves at a same pitch, and to a depth close to the interface between the respective thermoelectric semiconductor blocks and the base thereof, in the n-type thermoelectric semiconductor block and the p-type thermoelectric semiconductor block, respectively;

a first fitting process of fitting the two pairs of the n-type thermoelectric semiconductor composite block and the p-type thermoelectric semiconductor composite block, with the grooves formed therein, respectively, by said first grooving process to each other, respectively, such that respective grooved surfaces face each other;

a first adhesion process of forming two integrated blocks by adhering the two pairs of the n-type thermoelectric semiconductor composite blocks and p-type thermoelectric semiconductor composite blocks to each other, respectively, by filling gaps in fitting parts between the respective n-type thermoelectric semiconductor composite blocks and p-type thermoelectric semiconductor composite blocks, fitted to each other by said first fitting process, with adhesive insulation members;

a second grooving process of forming two grooved integrated blocks by forming a plurality of grooves at a same pitch in the two integrated blocks formed, respectively, by said first adhesion process, in the direction crossing the direction of the grooves formed by said first grooving process, and to a depth close to an interface between the respective thermoelectric semiconductor blocks and the base thereof;

a second fitting process of fitting the two grooved integrated blocks to each other such that respective grooved surfaces face each other;

a second adhesion process of forming a second integrated block by adhering the two grooved integrated blocks, fitted to each other by said second fitting process, to each by filling gaps in fitting parts between the two grooved integrated blocks with adhesive insulation members; and a thermoelectric semiconductor pieces exposure process of exposing n-type and p-type thermoelectric semiconductor pieces by removing the respective bases of the second integrated block;

characterized in that before the n-type thermoelectric semiconductor block and the p-type thermoelectric semiconductor are bonded to the bases, respectively, a metal coated layer is formed on the surface of the respective thermoelectric semiconductor blocks, bonded to the respective bases, and on the surface thereof on the opposite side.

17. A method of fabricating a thermoelectric device according to claim 16, further comprising an electrode formation process of forming electrodes for connecting the exposed n-type and p-type thermoelectric semiconductor pieces to each other alternately and in series by use of an electrically conductive paste applied on the metal coated layer after the thermoelectric semiconductor pieces exposure process.

18. A method of fabricating a thermoelectric device comprising:

a grooved block fabrication process of forming grooved blocks composed of an n-type thermoelectric semiconductor and a p-type thermoelectric semiconductor, respectively, each provided with a plurality of grooves formed at a same pitch and parallel with each other in only one direction, leaving a depthwise portion of respective grooved blocks intact;

a fitting process of fitting the grooved blocks composed of the n-type thermoelectric semiconductor and the p-type thermoelectric semiconductor formed, respectively, by said grooved block fabrication process to each other such that surfaces of the respective grooved blocks, with the grooves formed thereon, face each other;

an adhesion process of forming an integrated block by adhering the grooved block composed of the n-type thermoelectric semiconductor and the grooved block composed of the p-type thermoelectric semiconductor, fitted to each other by said fitting process, to each other after filling up gaps in fitting parts between the respective grooved blocks with an adhesive insulation member;

a second grooving process of forming a plurality of grooves in the integrated block formed by said adhesion process, in the direction crossing the direction of the grooves formed by said grooved block fabrication process, leaving a depthwise portion of the integrated block intact;

a solidification process of filling up the grooves formed by said second grooving process with an adhesive insulation member and solidifying the same; and a thermoelectric semiconductor pieces exposure process of exposing n-type and p-type thermoelectric semiconductor pieces by removing all portions of the integrated block wherein the adhesive insulation member filling up the grooves is solidified in said solidification process, other than the fitting parts where the grooved block composed of the n-type thermoelectric semiconductor and the grooved block composed of the p-type thermoelectric semiconductor are fitted to each other;

further comprising a metal layer formation process of forming metal layers on respective surfaces of the exposed n-type and p-type thermoelectric semiconductor pieces, where the electrodes are formed, and an electrode formation process of forming the electrodes for connecting the exposed n-type and p-type thermoelectric semiconductor pieces to each other alternatively and in series over the metal layers, said processes being applied after the thermoelectric semiconductor pieces exposure process;

characterized in that the electrodes are formed by use of an electrically conductive paste in the electrode formation process.

19. A method of fabricating a thermoelectric device comprising:

a grooved block fabrication process of forming two pairs of grooved blocks composed of an n-type thermoelectric semiconductor and a p-type thermoelectric semiconductor, respectively, provided with a plurality of grooves formed at a same pitch and parallel with each other, respectively, leaving a depthwise portion of respective grooved blocks intact;

a first fitting process of fitting each pair of the grooved blocks composed of the n-type thermoelectric semiconductor and the grooved block of the p-type thermoelectric semiconductor, formed by said grooved block fabrication process, to each other such that surfaces with the grooves formed thereon face each other;

a first adhesion process of forming two integrated blocks by filling up gaps in fitting parts between each pair of the grooved blocks composed of the n-type thermoelectric semiconductor and the p-type thermoelectric semiconductor, respectively, fitted to each other by said first fitting process, with adhesive insulation members, and solidifying the same;

a grooving process of forming two grooved integrated blocks by forming in each of the two integrated blocks a plurality of grooves at a same pitch and in the direction crossing the direction of the grooves formed by said grooved block fabrication process, leaving a depthwise portion of respective integrated blocks intact;

a second fitting process of fitting the two grooved integrated blocks to each other such that surfaces with the grooves thus formed thereon face each other;

a second adhesion process of forming a second integrated block by filling gaps in fitting parts between the two grooved integrated blocks fitted to each other by said fitting process with adhesive insulation members, and solidifying the same; and a thermoelectric semiconductor pieces exposure process of exposing n-type and p-type thermoelectric semiconductor pieces by removing all depthwise portions of the second integrated block, other than the fitting parts;

further comprising a metal layer formation process of forming metal layers on respective surfaces of the exposed n-type and p-type thermoelectric semiconductor pieces, where the electrodes are formed, and an electrode formation process of forming the electrodes for connecting the exposed n-type and p-type thermoelectric semiconductor pieces to each other alternatively and in series over the metal layers, said processes being applied after the thermoelectric semiconductor pieces exposure process;

characterized in that the electrodes are formed by use of an electrically conductive paste in the electrode formation process.

20. A method of fabricating a thermoelectric device comprising:

a first grooving process applied to an n-type thermoelectric semiconductor composite block prepared by bonding an n-type thermoelectric semiconductor block to a base and a p-type thermoelectric semiconductor composite block prepared by bonding a p-type thermoelectric semiconductor block to a base, for forming a plurality of grooves in the n-type thermoelectric semiconductor block and the p-type thermoelectric semiconductor block, respectively, at a same pitch in only one direction, and to a depth close to the interface between the respective thermoelectric semiconductor blocks and the base thereof;

a fitting process of fitting the n-type thermoelectric semiconductor composite block and p-type thermoelectric semiconductor composite block, with the grooves formed by said first grooving process, respectively, to each other such that respective grooved surfaces face each other;

an adhesion process of forming an integrated block by filling gaps in fitting parts between the n-type thermoelectric semiconductor composite block and the p-type thermoelectric semiconductor composite block, fitted to each other by said fitting process, with adhesive insulation members so as to adhere the n-type thermoelectric semiconductor composite block and the p-type thermoelectric semiconductor composite block to each other;

a second grooving process of forming a plurality of grooves in the direction crossing the direction of the grooves formed by said first grooving process, and to a depth close to the interface between the respective thermoelectric semiconductor blocks and the base thereof in the integrated block formed by said adhesion process;

a solidification process of filling up the grooves formed by said second grooving process with insulation members, and solidifying the same; and a thermoelectric semiconductor pieces exposure process of exposing n-type and p-type thermoelectric semiconductor pieces by removing the respective bases of the integrated blocks wherein the grooves are filled with the insulation member and the insulation member is then solidified in said solidification process;

further comprising a metal layer formation process of forming metal layers on respective surfaces of the exposed n-type and p-type thermoelectric semiconductor pieces, where the electrodes are formed, and an electrode formation process of forming the electrodes for connecting the exposed n-type and p-type thermoelectric semiconductor pieces to each other alternatively and in series over the metal layers, said processes being applied after the thermoelectric semiconductor pieces exposure process;

characterized in that the electrodes are formed by use of an electrically conductive paste in the electrode formation process.

21. A method of fabricating thermoelectric device comprising:

a first grooving process applied to two n-type thermoelectric semiconductor composite blocks prepared by bonding an n-type thermoelectric semiconductor block to a base, respectively, and two p-type thermoelectric semiconductor composite blocks prepared by bonding a p-type thermoelectric semiconductor block to a base, respectively, for forming a plurality of grooves at a same pitch, and to a depth close to the interface between the respective thermoelectric semiconductor blocks and the base thereof, in the n-type thermoelectric semiconductor block and the p-type thermoelectric semiconductor block, respectively;

a first fitting process of fitting the two pairs of the n-type thermoelectric semiconductor composite block and the p-type thermoelectric semiconductor composite block, with the grooves formed therein, respectively, by said first grooving process to each other, respectively, such that respective grooved surfaces face each other;

a first adhesion process of forming two integrated blocks by adhering the two pairs of the n-type thermoelectric semiconductor composite blocks and p-type thermoelectric semiconductor composite blocks to each other, respectively, by filling gaps in fitting parts between the respective n-type thermoelectric semiconductor composite blocks and p-type thermoelectric semiconductor composite blocks, fitted to each other by said first fitting process, with adhesive insulation members;

a second grooving process of forming two grooved integrated blocks by forming a plurality of grooves at a same pitch in the two integrated blocks formed, respectively, by said first adhesion process, in the direction crossing the direction of the grooves formed by said first grooving process, and to a depth close to an interface between the respective thermoelectric semiconductor blocks and the base thereof;

a second fitting process of fitting the two grooved integrated blocks to each other such that respective grooved surfaces face each other;

a second adhesion process of forming a second integrated block by adhering the two grooved integrated blocks, fitted to each other by said second fitting process, to each by filling in fitting parts between the two grooved integrated blocks with adhesive insulation members; and a thermoelectric semiconductor pieces exposure process of exposing n-type and p-type thermoelectric semiconductor pieces by removing the respective bases of the second integrated block;

further comprising a metal layer formation process of forming metal layers on respective surfaces of the exposed n-type and p-type thermoelectric semiconductor pieces, where the electrodes are formed, and an electrode formation process of forming the electrodes for connecting the exposed n-type and p-type thermoelectric semiconductor pieces to each other alternatively and in series over the metal layers, said processes being applied after the thermoelectric semiconductor pieces exposure process;

characterized in that the electrodes are formed by use of an electrically conductive paste in the electrode formation process.

22. A method of fabricating a thermoelectric device, comprising:

a grooved block fabrication process of forming grooved blocks composed of an n-type thermoelectric semiconductor and p-type thermoelectric semiconductor, respectively, each provided with a plurality of grooves formed at a same pitch and parallel with each other, leaving a depthwise portion of respective grooved blocks intact;

a fitting process of fitting the grooved blocks composed of the n-type thermoelectric semiconductor and p-type thermoelectric semiconductor formed, respectively, by said grooved block fabrication process to each other such that surfaces of the respective grooved blocks, with the grooves formed thereon, face each other;

an adhesion process of forming an integrated block by adhering the grooved block composed of the n-type thermoelectric semiconductor and the grooved block composed of the p-type thermoelectric semiconductor, fitted to each other by said fitting process, to each other after filling up gaps in fitting parts between the respective grooved blocks with an adhesive insulation member; and a thermoelectric semiconductor pieces exposure process of exposing n-type and p-type thermoelectric semiconductor pieces by removing all portions of the integrated block formed by said adhesion process, other than the fitting parts where the grooved block composed of the n-type thermoelectric semiconductor and the grooved block composed of the p-type thermoelectric semiconductor are fitted to each other;

characterized in that provisional fixture layers as insulation members for filling up the gaps in the fitting parts are formed using a material removable by heating or by use of a solvent in the adhesion process;

said method further comprising an electrode formation process of forming electrodes for connecting the exposed n-type and p-type thermoelectric semiconductor pieces to each other alternately and in series after the thermoelectric semiconductor pieces exposure process, fabricating a provisional thermoelectric device, and thereafter performing a process of fixedly attaching a heat radiation plate to one of the surfaces of the provisional thermoelectric device, where the electrodes are formed, and a heat absorption plate to the other via an insulating fixture layer, respectively, and a process of removing the provisional fixture layers either by heating or by use of a solvent after said preceding process.

23. A method of fabricating a thermoelectric device comprising:

a grooved block fabrication process of forming grooved blocks composed of an n-type thermoelectric semiconductor and a p-type thermoelectric semiconductor, respectively, each provided with a plurality of grooves formed at a same pitch and parallel with each other in only one direction, leaving a depthwise portion of respective grooved blocks intact;

a fitting process of fitting the grooved blocks composed of the n-type thermoelectric semiconductor and the p-type thermoelectric semiconductor formed, respectively, by said grooved block fabrication process to each other such that surfaces of the respective grooved blocks, with the grooves formed thereon, face each other;

an adhesion process of forming an integrated block by adhering the grooved block composed of the n-type thermoelectric semiconductor and the grooved block composed of the p-type thermoelectric semiconductor, fitted to each other by said fitting process, to each other after filling up gaps in fitting parts between the respective grooved blocks with an adhesive insulation member;

a second grooving process of forming a plurality of grooves in the integrated block formed by said adhesion process, in the direction crossing the direction of the grooves formed by said grooved block fabrication process, leaving a depthwise portion of the integrated block intact;

a solidification process of filling up the grooves formed by said second grooving process with an adhesive insulation member and solidifying the same; and a thermoelectric semiconductor pieces exposure process of exposing n-type and p-type thermoelectric semiconductor pieces by removing all portions of the integrated block wherein the adhesive insulation member filling up the grooves is solidified in said solidification process, other than the fitting parts where the grooved block composed of the n-type thermoelectric semiconductor and the grooved block composed of the p-type thermoelectric semiconductor are fitted to each other;

characterized in that provisional fixture layers are formed using a material removable by heating or by use of a solvent as at least either of the insulation members for filling up the gaps in the fitting parts in the adhesion process or the insulation members for filling up the grooves in the solidification process;

said method further comprising an electrode formation process of forming electrodes for connecting the exposed n-type and p-type thermoelectric semiconductor pieces to each other alternately and in series after the thermoelectric semiconductor pieces exposure process, fabricating a provisional thermoelectric device, and thereafter performing a process of fixedly attaching a heat radiation plate to one of the surfaces of the provisional thermoelectric device, where the electrodes are formed, and a heat absorption plate to the other via an insulating fixture layer, respectively, and a process of removing the provisional fixture layers either by heating or by use of a solvent after said preceding process.

24. A method of fabricating a thermoelectric device comprising:

a first grooving process applied to an n-type thermoelectric semiconductor composite block prepared by bonding an n-type thermoelectric semiconductor block to a base and a p-type thermoelectric semiconductor composite block prepared by bonding a p-type thermoelectric semiconductor block to a base, for forming a plurality of grooves in the n-type thermoelectric semiconductor block and the p-type thermoelectric semiconductor block, respectively, at a same pitch in only one direction, and to a depth close to the interface between the respective thermoelectric semiconductor blocks and the base thereof;

a fitting process of fitting the n-type thermoelectric semiconductor composite block and p-type thermoelectric semiconductor composite block, with the grooves formed by said first grooving process, respectively, to each other such that respective grooved surfaces face each other;

an adhesion process of forming an integrated block by filling gaps in fitting parts between the n-type thermoelectric semiconductor composite block and the p-type thermoelectric semiconductor composite block, fitted to each other by said fitting process, with adhesive insulation members so as to adhere the n-type thermoelectric semiconductor composite block and the p-type thermoelectric semiconductor composite block to each other;

a second grooving process of forming a plurality of grooves in the direction crossing the direction of the grooves formed by said first grooving process, and to a depth close to the interface between the respective thermoelectric semiconductor blocks and the base thereof in the integrated block formed by said adhesion process;

a solidification process of filling up the grooves formed by said second grooving process with insulation members, and solidifying the same; and a thermoelectric semiconductor pieces exposure process of exposing n-type and p-type thermoelectric semiconductor pieces by removing the respective bases of the integrated blocks wherein the grooves are filled with the insulation member and the insulation member is then solidified in said solidification process;

characterized in that provisional fixture layers are formed using a material removable by heating or by use of a solvent as at least either of the insulation members for filling up the gaps in the fitting parts in the adhesion process or the insulation members for filling up the grooves in the solidification process;

said method further comprising an electrode formation process of forming electrodes for connecting the exposed n-type and p-type thermoelectric semiconductor pieces to each other alternately and in series after the thermoelectric semiconductor pieces exposure process, fabricating a provisional thermoelectric device, and thereafter performing a process of fixedly attaching a heat radiation plate to one of the surfaces of the provisional thermoelectric device, where the electrodes are formed, and a heat absorption plate to the other via an insulating fixture layer, respectively, and a process of removing the provisional fixture layers either by heating or by use of a solvent after said preceding process.

25. A method of fabricating a thermoelectric device comprising:

a grooved block fabrication process of forming two pairs of grooved blocks composed of an n-type thermoelectric semiconductor and a p-type thermoelectric semiconductor, respectively, provided with a plurality of grooves formed at a same pitch and parallel with each other, respectively, leaving a depthwise portion of respective grooved blocks intact;

a first fitting process of fitting each pair of the grooved blocks composed of the n-type thermoelectric semiconductor and the grooved block of the p-type thermoelectric semiconductor, formed by said grooved block fabrication process, to each other such that surfaces with the grooves formed thereon face each other;

a first adhesion process of forming two integrated blocks by filling up gaps in fitting parts between each pair of the grooved blocks composed of the n-type thermoelectric semiconductor and the p-type thermoelectric semiconductor, respectively, fitted to each other by said first fitting process, with adhesive insulation members, and solidifying the same;

a grooving process of forming two grooved integrated blocks by forming in each of the two integrated blocks a plurality of grooves at a same pitch and in the direction crossing the direction of the grooves formed by said grooved block fabrication process, leaving a depthwise portion of respective integrated blocks intact;

a second fitting process of fitting the two grooved integrated blocks to each other such that surfaces with the grooves thus formed thereon face each other;

a second adhesion process of forming a second integrated block by filling gaps in fitting parts between the two grooved integrated blocks fitted to each other by said fitting process with adhesive insulation members, and solidifying the same; and a thermoelectric semiconductor pieces exposure process of exposing n-type and p-type thermoelectric semiconductor pieces by removing all depthwise portions of the second integrated block, other than the fitting parts;

characterized in that provisional fixture layers as insulation members for filing up gaps in the fitting parts are formed using a material removable by heating or by use of a solvent in the first adhesion process or the second adhesion process;

said method further comprising an electrode formation process of forming electrodes for connecting the exposed n-type and p-type thermoelectric semiconductor pieces to each other alternately and in series after the thermoelectric semiconductor pieces exposure process, fabricating a provisional thermoelectric device, and thereafter performing a process of fixedly attaching a heat radiation plate to one of the surfaces of the provisional thermoelectric device, where the electrodes are formed, and a heat absorption plate to the other via an insulating fixture layer, respectively, and a process of removing the provisional fixture layers either by heating or by use of a solvent after said preceding process.

26. A method of fabricating thermoelectric device comprising:

a first grooving process applied to two n-type thermoelectric semiconductor composite blocks prepared by bonding an n-type thermoelectric semiconductor block to a base, respectively, and two p-type thermoelectric semiconductor composite blocks prepared by bonding a p-type thermoelectric semiconductor block to a base, respectively, for forming a plurality of grooves at a same pitch, and to a depth close to the interface between the respective thermoelectric semiconductor blocks and the base thereof, in the n-type thermoelectric semiconductor block and the p-type thermoelectric semiconductor block, respectively;

a first fitting process of fitting the two pairs of the n-type thermoelectric semiconductor composite block and the p-type thermoelectric semiconductor composite block, with the grooves formed therein, respectively, by said first grooving process to each other, respectively, such that respective grooved surfaces face each other;

a first adhesion process of forming two integrated blocks by adhering the two pairs of the n-type thermoelectric semiconductor composite blocks and p-type thermoelectric semiconductor composite blocks to each other, respectively, by filling gaps in fitting parts between the respective n-type thermoelectric semiconductor composite blocks and p-type thermoelectric semiconductor composite blocks, fitted to each other by said first fitting process, with adhesive insulation members;

a second grooving process of forming two grooved integrated blocks by forming a plurality of grooves at a same pitch in the two integrated blocks formed, respectively, by said first adhesion process, in the direction crossing the direction of the grooves formed by said first grooving process, and to a depth close to an interface between the respective thermoelectric semiconductor blocks and the base thereof;

a second fitting process of fitting the two grooved integrated blocks to each other such that respective grooved surfaces face each other;

a second adhesion process of forming a second integrated block by adhering the two grooved integrated blocks, fitted to each other by said second fitting process, to each by filling in fitting parts between the two grooved integrated blocks with adhesive insulation members; and a thermoelectric semiconductor pieces exposure process of exposing n-type and p-type thermoelectric semiconductor pieces by removing the respective bases of the second integrated block;

characterized in that provisional fixture layers as insulation members for filing up gaps in the fitting parts are formed using a material removable by heating or by use of a solvent in the first adhesion process or the second adhesion process;

said method further comprising an electrode formation process of forming electrodes for connecting the exposed n-type and p-type thermoelectric semiconductor pieces to each other alternately and in series after the thermoelectric semiconductor pieces exposure process, fabricating a provisional thermoelectric device, and thereafter performing a process of fixedly attaching a heat radiation plate to one of the surfaces of the provisional thermoelectric device, where the electrodes are formed, and a heat absorption plate to the other via an insulating fixture layer, respectively, and a process of removing the provisional fixture layers either by heating or by use of a solvent after said preceding process.

* * * * *